United States Patent [19]

Germer et al.

[11] 4,199,717

[45] Apr. 22, 1980

[54] TIME OF DAY DEMAND METERING SYSTEM AND METHOD

[75] Inventors: Warren R. Germer, Rochester; Ansell W. Palmer, Hampton, both of N.H.

[73] Assignee: General Electric Company, Somersworth, N.H.

[21] Appl. No.: 881,503

[22] Filed: Feb. 27, 1978

[51] Int. Cl.² .................... G01R 15/08; G01R 19/16
[52] U.S. Cl. .............................. 324/116; 324/103 R; 364/483
[58] Field of Search ................... 324/116, 103 R; 364/483

[56] References Cited

U.S. PATENT DOCUMENTS

| | | | |
|---|---|---|---|
| 2,132,256 | 10/1938 | Cameron | 324/116 |
| 2,139,821 | 12/1938 | Greenwood et al. | 324/103 R |
| 2,246,185 | 6/1941 | Pratt | 324/116 |
| 3,913,014 | 10/1975 | Halstead et al. | 324/116 |
| 4,050,020 | 9/1977 | Germer et al. | 324/116 |

FOREIGN PATENT DOCUMENTS 1170235 11/1969 United Kingdom.
1516363 7/1978 United Kingdom.

Primary Examiner—Rudolph V. Rolinec
Assistant Examiner—Ernest F. Karlsen
Attorney, Agent, or Firm—Robert E. Brunson

[57] ABSTRACT

A time of day demand metering system is disclosed for registering the amount of electrical energy consumed during the one demand interval of maximum electrical energy consumption out of a plurality of demand intervals. Means is provided to engage the register of a time of day meter only during those demand intervals when the amount of electrical energy being consumed is in excess of the one previous demand interval of maximum electrical energy consumption.

13 Claims, 17 Drawing Figures

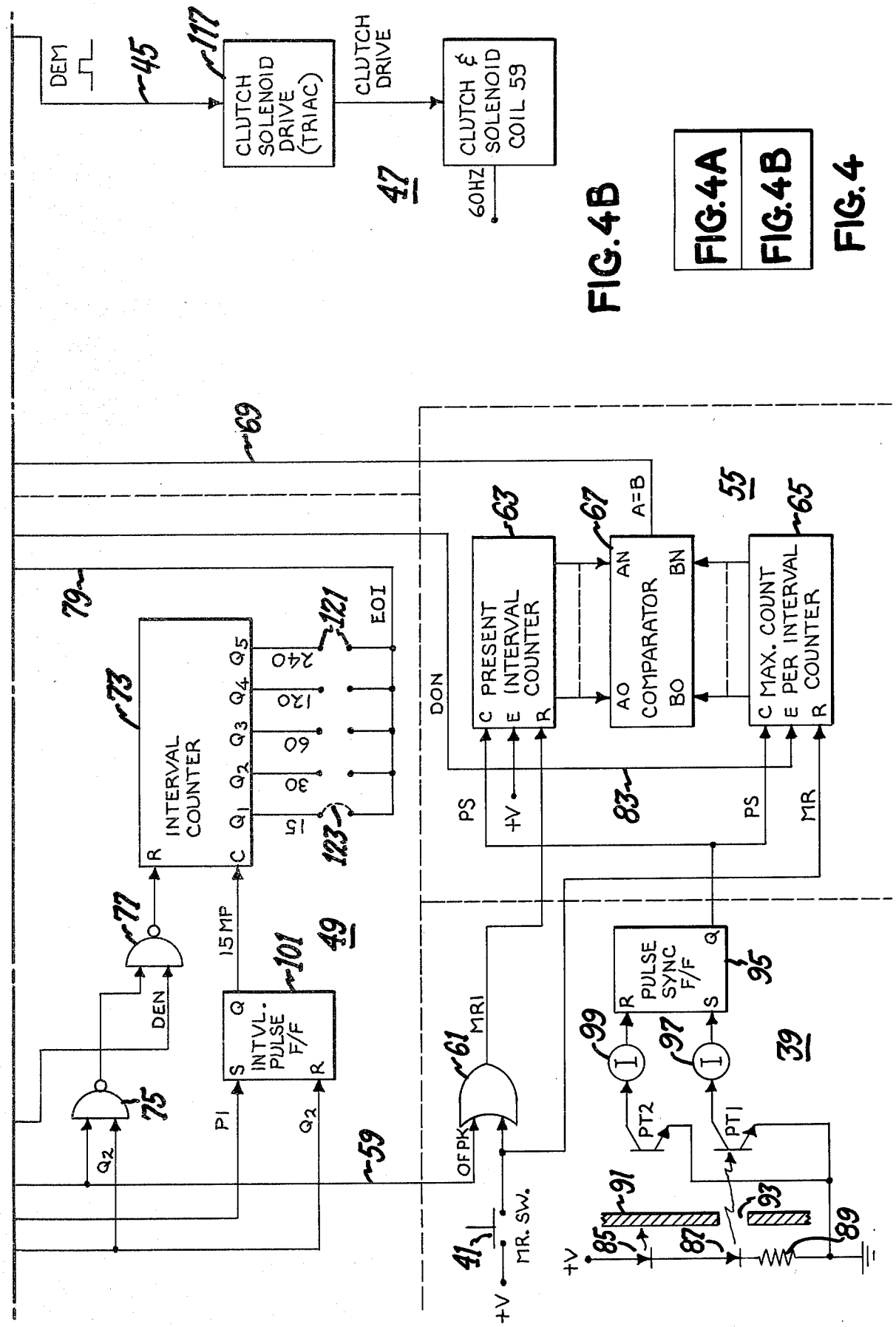

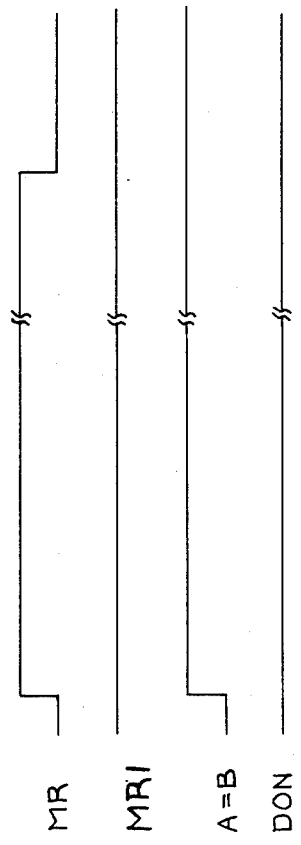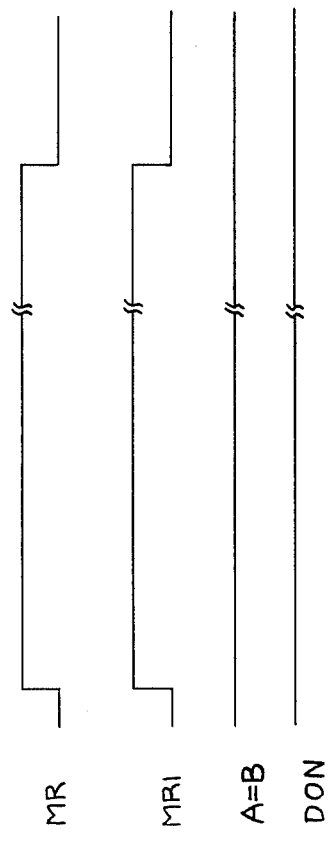

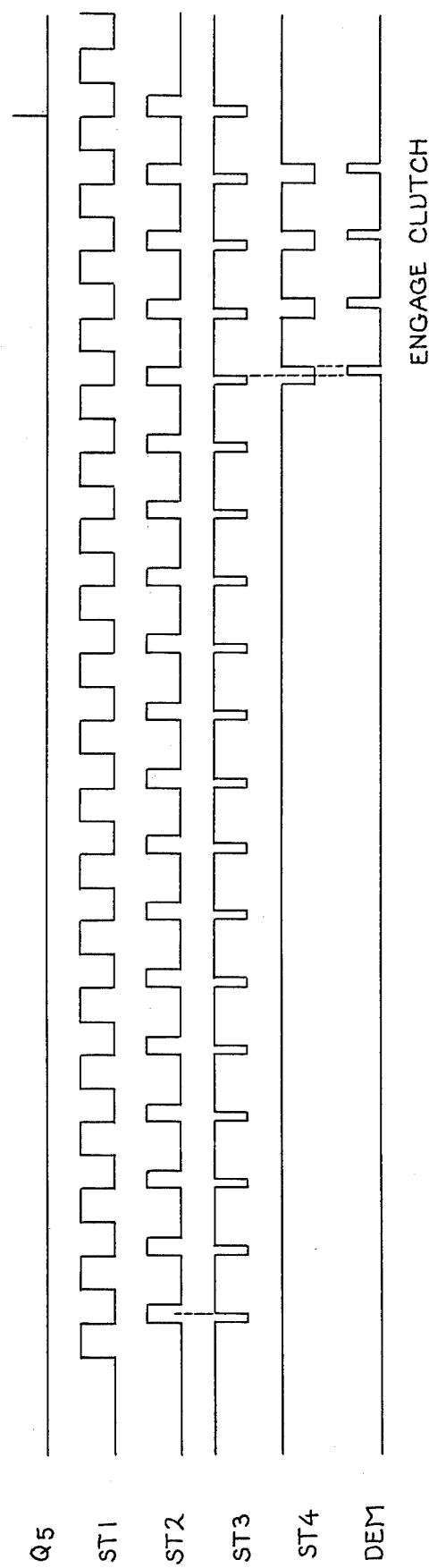

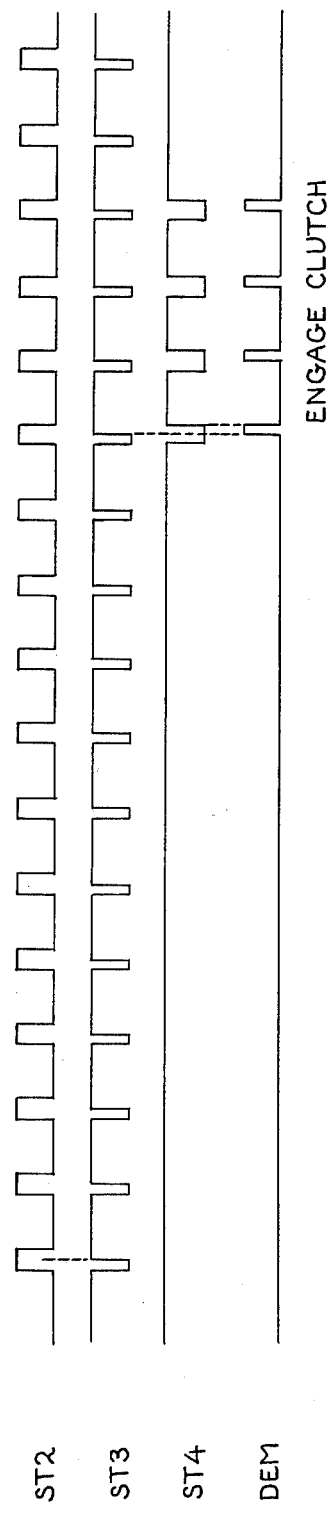

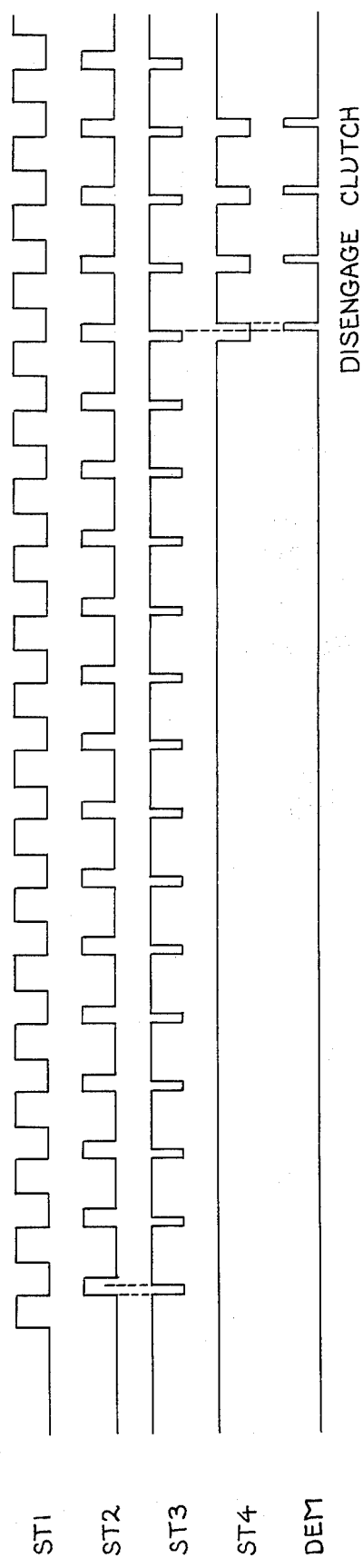

TIME OF DAY DEMAND METERING SYSTEM AND METHOD

BACKGROUND OF THE INVENTION

This invention relates generally to demand metering systems and more particularly to electronically controlled time of day demand metering systems for registering the amount of electrical energy consumed during specified demand time intervals of the day.

Utility companies have generally sold electrical energy on the basis of a fixed rate schedule regardless of whether high or low demand has been made upon the electrical generation system. This type of rate scheduling has not provided the consumer with the incentive to voluntarily reduce his power consumption, particularly during those periods of high peak demand. As a result, in order to prevent overloading the power distribution system, utility companies have had to add additional power generating capacity which can be brought on line during peak power periods. The addition of this power generating capacity has placed an economic burden on the utility companies as well as the consumer, as the cost of the power generating equipment must be passed on to the consumer. This is an undesirable economic burden, particularly when it is realized that the additional power generating equipment is brought on line only during those periods of high peak demand. Thus, the additional equipment is only used part time, resulting in inefficiencies since a much larger power generating plant and distribution system than is economically desirable is required in order to meet those periods of peak demand.

In the past few years, with the escalating costs of generating electrical energy, utility companies and the manufacturers of electrical energy metering systems have attempted to develop equipment and devices which will provide for more efficient use of electrical generation and power distribution facilities during both on and off peak load periods. Many of these devices have resulted in the development of multiple rate metering of electrical power consumption which adopts the philosophy that the consumer whose consumption of electrical energy is principally during on-peak demand periods should be billed at a higher rate than the consumer whose consumption is primarily during periods of low, off-peak or mid-peak periods.

This multiple rate price structuring appears to be justified when it is realized that the low demand usage customer who is billed at the same rate as the high demand usage customer, in effect subsidizes the high demand user. Differential pricing would, therefore, from a customer standpoint, appear to be more equitable. From the standpoint of the utility companies, a multiple rate pricing structure will encourage consumers of electrical power to shift their consumption of power from on-peak intervals to off-peak intervals, thus increasing the overall power distribution system efficiency and reducing the capital expenditures normally required to supply extra power generating equipment during on-peak periods.

So far as it is known, the prior art systems have employed, for the most part, conventional kilowatt-hour meters having two sets of register dials to provide a dual rate price structured billing system. One such prior art attempt to individually register different amounts of power consumed during different intervals of the day is disclosed in U.S. Pat. No. 2,139,821 to Greenwood et al. In that patent, a simplified two-stage mechanical watt meter mechanism having an associated clcok timer is disclosed. Cams on the clock timer are used to trip a mechanism which, at selected times during the day, permit the selective driving of one or the other of two sets of meter register dials so that the amount of electrical energy consumed during the various on and off peak periods of the day can be registered on the appropriate dials.

Developments subsequent to Greenwood et al by Pratt (U.S. Pat. No. 2,246,185) and Cameron (U.S. Pat. No. 2,132,256) utilized dual rate metering systems incorporating a clock which determined which set of various meters were to be activated during the various on and off peak periods. Other dual rate kilowatt-hour metering systems which exemplify representative prior art structures are disclosed in the following patents: Barstow U.S. Pat. No. 548,419; Cox U.S. Pat. No. 585,258; Qxley U.S. Pat. Nos. 591,195 and 593,852; Wilson U.S. Pat. No. 596,283; Kapp U.S. Pat. No. 597,985; Oxley U.S. Pat. No. 710,070; Mayer U.S. Pat. No. 1,078,206; Ogurpowski U.S. Pat. No. 2,415,653; Feldman et al U.S. Pat. No. 3,683,343; and Kahn U.S. Pat. No. 2,915,704.

Another prior art multiple rate structuring system is disclosed in U.S. Pat. No. 4,050,020 to Germer et al and assigned to the assignee of the present invention. This patent is directed toward an electronic time-of-day metering system which is preprogrammed to selectively activate two sets of register dials at predetermined times of the day to register the amount of power consumption during designated peak intervals (e.g. high-peak and mid-peak). The present invention is ideally suited for operation with the invention of the U.S. Pat. No. 4,050,020, comprises an improvement thereof and is incorporated specifically herein as an essential reference. Further, U.S. Patent application Ser. No. 724,040, filed Sept. 17, 1976, now U.S. Pat. No. 4,093,997 entitled "Portable Programmer for Time-of-Day Metering Register System" and assigned to the assignee of the present invention discloses a programmer for programming the meter of U.S. Pat. No. 4,050,020 and the present invention.

To further encourage consumers to utilize less power during on-peak intervals, utility companies have suggested a three rate billing structure. In that type of structure, the consumer is billed at the normal rate for his total power consumption, plus an additional amount at a higher rate for the amount of power he uses during on-peak intervals. This is just like the previously described two rate structure. However, in the three rate pricing structure, the consumer is billed still an additional amount for the amount of power he consumes in the one demand interval of maximum power consumption. For example, in a 30 day month, there may be thirty programmed on-peak periods (1 per day), with each period lasting six hours. However, during each of these periods there may be extremely high peak intervals when the demand for more energy places an overload burden on the power distribution system causing the utility company to bring additional power generating equipment on line, thus increasing the cost of power generation. It is during these extremely high peak intervals that the consumer will pay an additional amount, if his demand for power exceeds a predetermined amount as established by the utility company. However, the consumer will pay only for that amount of enrgy consumed in the one demand interval, out of all of the demand intervals, of maximum energy consumption.

There has been proposed, various types of three rate billing structured systems. One such system contemplates the use of three conventional kilowatt-hour meters interconnected through various mechanical clock and switch mechanisms. One of the meters continuously registers the total amount of consumed energy, while a second meter is engaged via the clock and switch mechanism to register the amount of energy consumed during predetermined on-peak periods. A third meter is engaged, via the clock and switch mechanism, to register the amount of energy consumed during predetermined demand intervals during the on-peak periods. The utility company, taking the various meter readings, can then bill the customer according to his usage of energy using the three rate structure. While the there meter time-of-day demand system proposed may functionally perform, it has not received wide acceptance by the utility companies due to the excess costs of three meters plus additional installation expenses.

Therefore, a need exists for a fully integrated single time-of-day demand metering system utilizing one meter which provides the full capability of implementing an easily installed and readily changeable three rate billing structure to the changing rate structures of the utility companies.

It is therefore an object of the present invention to provide an improved method and apparatus for measuring and displaying electrical power consumption on different meter displays to allow a three rate billing structure to be implemented.

It is another object to provide a time-of-day demand metering system having enhanced operating capabilities.

A further object of the invention is to provide a system for measuring the consumption of power from an electrical generation and distribution system during peak periods, during predetermined demand intervals occuring in those periods and registering the amount of energy consumed during the one period of maximum demand.

Another object is to provide a system including a programmable time-of-day demand meter having the capability of implementing a plurality of rate structured billing routines for selectively measuring and displaying the consumption of electrical energy from a power distribution system during on-peak periods and during demand intervals of various selected periods in order to encourage consumers of electrical power to shift consumption of power from on-peak to off-peak periods.

A still further object is to provide a method and apparatus in a time of day demand metering system for measuring the total consumption of electrical energy, the amount of energy consumed during prescribed peak power periods and the amount of energy consumed during the one demand interval of maximum energy consumption out of all of the peak power periods.

It is another object to provide a programmable meter in a time of day demand metering system including a method and apparatus for measuring the amount of energy consumed during predetermined peak power periods of the day and further measuring the amount of energy consumed during the one demand interval, out of a plurality of predetermined demand intervals, of maximum power demand.

SUMMARY OF THE INVENTION

The present invention accomplishes the foregoing objects by providing an energy distribution system including a method and apparatus for measuring peak and demand electrical power at predetermined times of the day and recording the amount of energy consumed on respective peak and demand mechanical recording devices. Further, a mechanical kilowatt-hour (KWH) meter having a conventional set of decade gear driven dials, registers, on a continuous basis, the total KWH's consumed by the system.

The consumption of peak and demand power is recorded on respective decade gear driven rate dials. The peak dials are capable of being engaged and disengaged at preselected peak power periods. The peak power periods may vary from day to day and hour to hour and, accordingly, a programmable logic control circuit is provided for selectively driving the peak rate dials and for also enabling the demand rate dials to be enabled during preselected intervals when power is in excess demand by the user (customer) of the system.

The programmable logic control circuit utilizes as its time base the 60 Hz frequency derived from the energy distribution system being metered. A clock circuit is provided for generating time in the form of a control signal at specified increments (e.g. every 15 minutes) on a weekly basis. The logic control circuit includes a memory which is preprogrammed to contain the times at which the peak rate dials are to be engaged and the times during which the demand rate dials may be actuated or engaged.

One function command or control signal is generated by the logic control circuit for engaging or disengaging the decade gear driven peak rate dials. Another function command or control signal is generated by the logic control circuit. This latter control signal is provided to a demand logic circuit at predetermined demand intervals to either enable or disable that circuit to engage or disengage the demand dials. A comparison is made between the magnitude of a new value proportional to the amount of energy being consumed and the magnitude of a previously stored value proportional to the one previous demand interval of maximum energy consumption. When the new value is at least equal to the previous value, the demand decade driven dials are engaged to register the amount of energy consumed in excess of the maximum previously registered for the remainder or duration of the present demand interval. The present demand interval is terminated by the control signal effecting a disengagement of the demand rate dials via the demand logic circuit.

BRIEF DESCRIPTION OF THE DRAWING

Other objects, features and advantages of the present invention, will become more fully apparent from the following detailed description of the preferred embodiment, the appended claims and the accompanying drawing in which:

FIG. 4 is a legendary drawing showing the inter-relationships between FIGS. 4A and 4B when positioned as illustrated, FIG. 4B is a detailed schematic logic diagram of the Demand Interval Counter/Logic, the Pulse Initiator Logic, the Time Interval Counter/Logic and the Meter Register Solenoid and Clutch Drive of FIG. 3, FIGS. 5, 6, 7A, 7B, 8A, 9A, 9B, 10A, 10B, 11A and 11B are timing diagrams having descriptive titles useful in understanding the operation of the present invention.

DESCRIPTION OF THE PREFERRED EMBODIMENT

Figure 2:
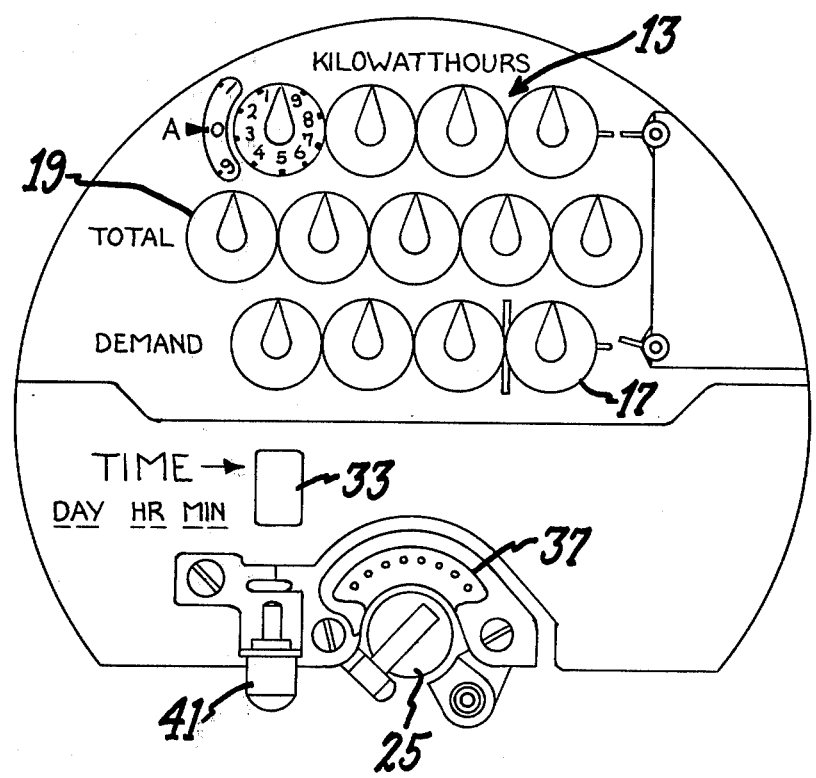
FIG. 2 is a front view of a preferred form of mechanical three rate register incorporating the present invention.

Referring first to FIG. 2, it should be understood that in the preferred embldiment two sets of decade gear driven register dials designated A (the on peak register) and Demand (for registering demand interval power consumption) are included in the mechanical portion of the KWH meter of the present invention. As illustrated in FIG. 2, these two sets of dials are positioned above and below a conventional set of five dials which continuously register total KWH consumption in the same manner as a conventional five-dial pointer register.

Figure 1:
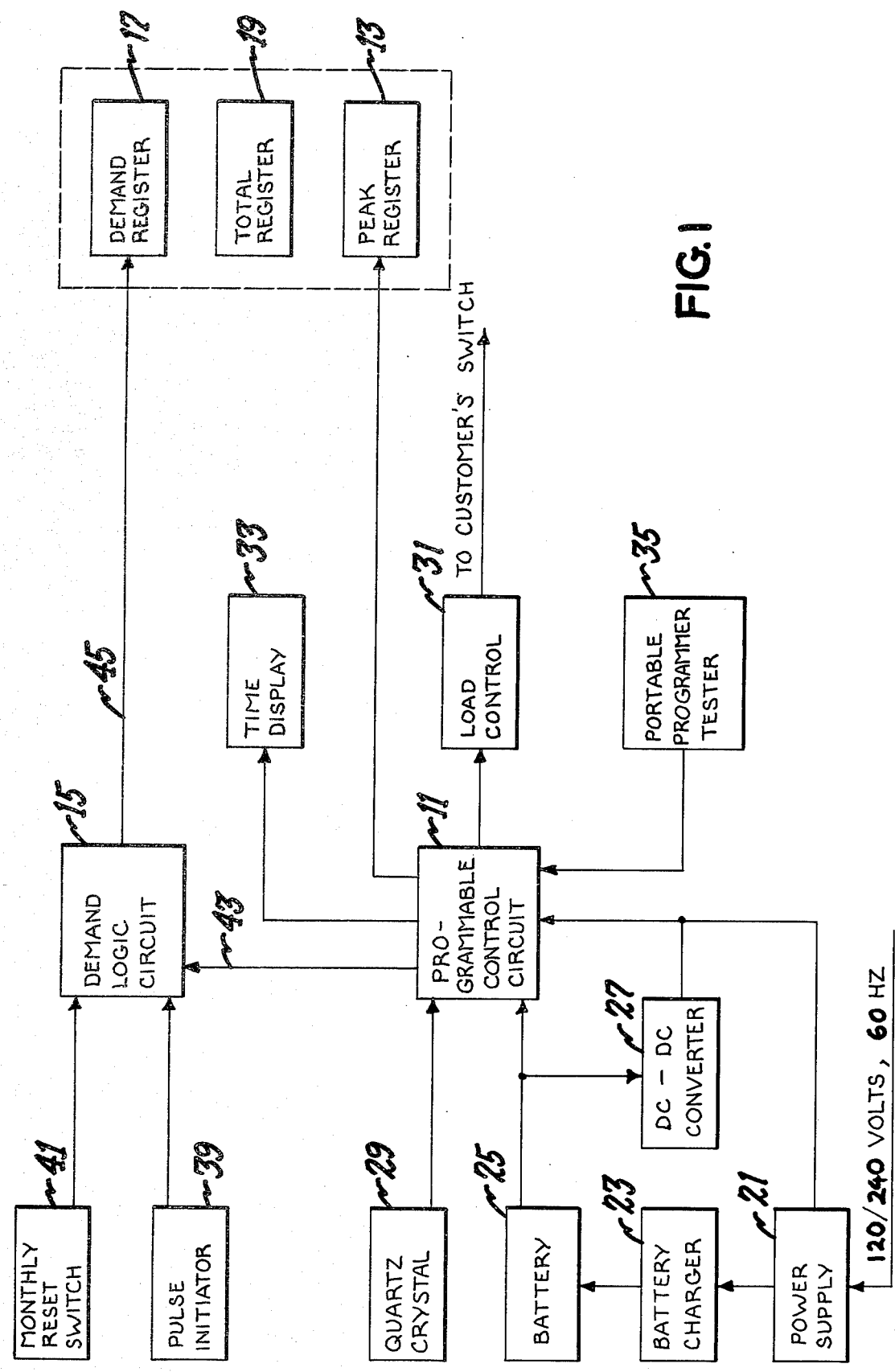
FIG. 1 is a high level schematic block diagram of the time of day demand metering system of the present invention.

Either set of dials, A or Demand, can be engaged to indicate consumption of power, or disengaged so that no consumption of power is registered, as determined by the programmable control circuit and the Demand logic circuit of FIG. 1. When disengaged, the A and Demand dials remain fixed at their last reading until again engaged.

The purpose of having the A and Demand dials selectively engageable is to provide utilities with a three-level rate billing structure, ie., total power usage on the Total register, ON-peak usage on the A register, and power usage on the Demand Register during preselected demand time intervals when the amount of power being consumed is in excess of the one previous demand interval of maximum power consumption.

Reference is now made to FIG. 1 which illustrates a Programmable Control Circuit 11. The detailed structure and operational description of that circuit disclosed in the aforementioned U.S. Pat. No. 4,050,020, and reference is made specifically thereto for those details. However, since the present invention makes use of certain signals generated by the Control Circuit 11, a brief description of that circuit is provided for clarification purposes and completeness of disclosure of the present invention.

Still referring to FIG. 1, the Control Circuit 11 generates contol signals at specified times for selectively engaging the Peak or A Register rate drive gears 13 and for enabling a Demand Logic Circuit 15 to provide a demand register engagement signal to the Demand Register rate drive gear train 17. The Total Register 19 receives no control signals and is driven in a conventional manner as is common in the standard KWH meter.

The Control Circuit 11 is energized from a 60 Hz power line via a power supply 21. A Battery Charger 23 receives current from the Power Supply 21 to charge a Rechargeable Battery 25. The Battery 25 is utilized to provide current to the control Circuit 11, both directly and through a DC-DC Converter 27, to keep the timing function of the control circuit operable should a power outage occur. In addition to providing power to the Control Circuit 11, the 60 Hz input to the power supply 21 is utilized as a time base for that circuit. The 60 Hz from the power supply is also provided to the Demand Logic Circuit for purposes to be described. A Quartz Crystal Oscillator 29 is also provided, and serves as an alternate time base input to the control circuit during power outages. Reference is made to the aforementioned U.S. Pat. No. 4,050,020 Patent for a detailed description of these latter elements.

The Programmable Control Circuit 11 also includes a timer in the form of a 7-day clock which performs the timing functions for enabling the Demand Logic Circuit 15 and for engaging and disengaging the drive gears of the Peak Register dials 13. The output of the 7-day clock is resolved into 15-minute intervals, with each output capable of controlling one or more timed functions at any one of the 15-minute intervals. As an example, signals from the 7-day clock can control disengagement of the Peak Register 13, enablement of the Demand Logic Circuit 12 and, if desired, switch on or off a Load Control Circuit 31 to control a customer's switch not shown. The Control Circuit 11 can be programmed to enable or inhibit the operation of any one or all of the Demand Logic Circuit, the Load Control Circuit or the Peak Register at any time of the day on a 7-day basis. The timer also drives a single digit Time Display 33 which sequentially displays the day, hours and minutes (see FIG. 2).

The Control Circuit 11 is electronically programmed by means of a Portable Programmer Tester 35 which is disclosed in the aforementioned copending patent application Ser. No. 724,040 filed on Sept. 17, 1976. The Portable Programmer Tester 35 is connected to the Control Circuit 11 by an electrical connector 37 (FIG. 2) which is accessed through a sealable opening in the meter enclosure (not shown). The Programmer Tester contains its own battery operated power supply, an oscillator controlled 7-day clock and appropriate circuitry for testing, reprogramming and setting the time of day demand metering system of the present invention.

Still referring to FIG. 1, the Demand Logic Circuit 15 receives input signals from a pulse initiator circuit 39 and a manually operable Monthly Reset Switch 41. The Pulse Initiator 39 continuously provides pulses to the Demand Logic Circuit proportional to the amount of electrical energy being consumed by the system. How these pulses are utilized by the Demand Logic Circuit will subsequently be described. The Monthly Reset Switch 41 is accessed through the meter front cover (see FIG. 2) and provides a reset signal to the Demand Logic Circuit 15 when actuated by a utility company employee such as a meter reader. The Reset Switch is normally utilized to initialize the Demand Logic Circuit each month after the meter dials have been read.

Figure 3:
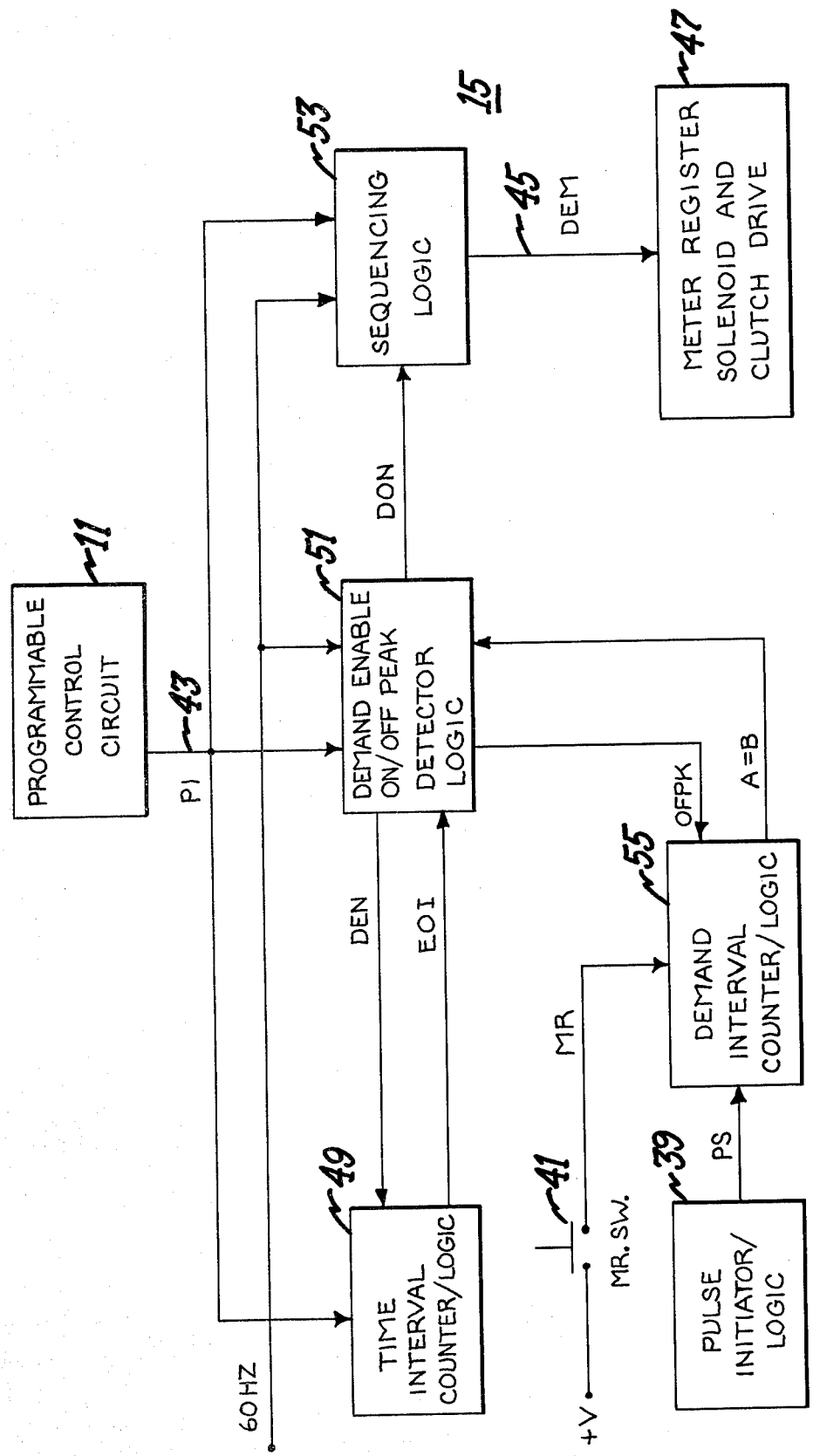
FIG. 3 is a schematic block diagram of the demand logic circuit of FIG. 1 and illustrates its interconnection to the programmable control circuit.

Reference is now made to FIG. 3 which is a schematic block diagram of the Demand Logic Circuit 15 of the present invention. The Programmable Control Circuit 11 is re-illusraed in FIG. 3 to more clearly show its relationship with the various circuits of the Demand Logic Circuit.

As previously described, the Control Circuit 11 receives the 60 Hz signal from the power supply 21 (FIG. 1) and utilizes this signal as a time base to generate an output function or control signal designated P1 on a conductor 43. Through the program and timing or clock circuits, the Control Circuit is capable of supplying the P1 signal at specific times to be either in or out of phase with the 60 Hz signal. In the aforementioned U.S. Pat. No. 4,050,020, the P1 signal is applied to a magnetically operated clutch assembly (see FIG. 5 of U.S. Pat. No. 4,050,020) via a transistor 73 and triac 69 to engage and disengage one set of alternate rate register dials in accordance with the phase relationship of the P1 and 60 Hz signals.

In the present invention, the Demand Logic Circuit has been inserted directly into the P1 signal line 43 feeding the drive transistor 73. This connection is illustrated in FIG. 1, showing the conductor 43 connected to the Demand Logic Circuit. An output conductor 45 provides the drive signal to transistor 73 to effect the engagement and disengagement of the register dials. In the present invention, that drive signal is shown as a DEM (Demand) signal in FIG. 3 feeding a block 47 designated as Meter Register Solenoid and Clutch Drive. The block 47 contains the transistor 73, triac 69, the solenoid and clutch drive and the Demand Register dials 17. In the present invention, while the Demand Register 17 is the same as the alternate register in the U.S. Pat. No. 4,050,020, it serves an entirely different purpose than in the U.S. Pat. No. 4,050,020 by accumulatively displaying demand power consumption under control of the Demand Logic Circuit 15.

Referring back to FIG. 3, the Demand Logic Circuit 15 is comprised basically of, (1) a Time Interval Counter/Logic 49, (2) a Demand Enable On/Off Peak Detector Logic 51, (3) a Sequencing Logic 53, (4) a Demand Interval Counter/Logic 55, (5) the Solenoid and Clutch Drive 47, (6) and the aforementioned Pulse Initiator Logic 39 and Manual Reset (MR.SW.) 41.

The Control Circuit 11 generates the P1 control signal at predetermined intervals (eg. 15 minute intervals). The P1 signal is received by each of the logic circuits 49, 51 and 53. It will be noted that the 60 Hz signal is also applied to logic circuits 51 and 53 along with the P1 signal, with those signals being either in or out of phase with respect to each other.

Considering first the Demand Enable On/Off Peak Detector Logic 51 (hereinafter referred to as Detector Logic Circuit), that circuit responds to the phase relationships between the P1 and 60 Hz signals to selectively generate three signals, (1) a DEN (Demand Enable) signal, (2) an OFPK (Off-Peak) signal, and (3) a DON (Demand On) signal. The DEN signal is provided as a binary 1 state signal to the Time Interval Counter/Logic 49 when the P1 and 60 Hz signals are in phase. When these latter two signals are out of phase, as detected by the Detector Logic Circuit 51, the DEN signal remains at a binary 0 state. Also when the DEN signal goes to a binary 0, the OFPK signal achieves a binary 1 state and remains in that state so long as the DEN signal is a binary 0. The OFPK signal also becomes a binary 1 in response to an EOI (End of Interval) signal applied to the Detector Logic 51 from the Interval Counter/Logic 49. The Detector Logic Circuit provides a binary 1 DON signal to the Sequencing Logic 53 in response to the binary 1 states of the DEN signal and an A=B signal from the Demand Interval Counter/Logic 55.

The purpose of the Time Interval Counter/Logic 49 (hereinafter referred to as Time Counter Logic) is to count the P1 signals and generate the EOI signal after a prescribed number of counts to terminate a demand time interval. The EOI signal causes the OFPK and DON signals to both achieve a binary 0 state.

Reference is now made to the Pulse Initiator Logic 39 and to the Demand Interval Counter/Logic 55 (hereinafter referred to as the Demand Counter Logic). The Demand Counter Logic consists basically of two counters for counting PS pulses generated by the pulse initiator logic 39 and a comparator for comparing the contents of those two counters. The MR.SW.41, when actuated, applies a +V binary 1 reset signal to both counters when the system is initialized causing the A=B signal to go to a binary 1. This action will cause the DON signal to go to a binary 1, if the DEN signal is at a binary 1 at the same time as the A=B binary 1 signal is generated. So long as the OFPK and DON signals are binary 0's, both counters can count the PS pulses. One of the counters is enabled to count by the DON signal and always contains an accumulative count proportional to the amount of electrical energy consumed during the one previous demand interval of maximum energy consumption. The other counter, which is reset by the OFPK signal at the end of each demand interval, is enabled to count during each demand interval and always contains a count proportional to the amount of electrical energy being consumed in the present demand interval. When the contents of the counters are equal, the A=B signal goes to a binary 1. This causes the first counter to now begin counting in unison with the other counter while simultaneously enabling the Sequencing Logic 53 to generate at least one output pulse DEM in response to the P1 and 60 Hz signals.

The Sequencing Logic 53 is capable of generating the DEM signal as a binary 1 shifted slightly in time to be either in or out phase with the 60 Hz signal. If the DEM signal is in phase with the 60 Hz signal applied to the clutch and solenoid coil 59 (See FIG. 4B of the present invention and FIG. 5 of the U.S. Pat. No. 4,050,020) the Demand Register 17 is engaged. On the other hand, if the DEM signal is out of phase with the 60 Hz signal, the Demand Register is disengaged.

Figure 4A:
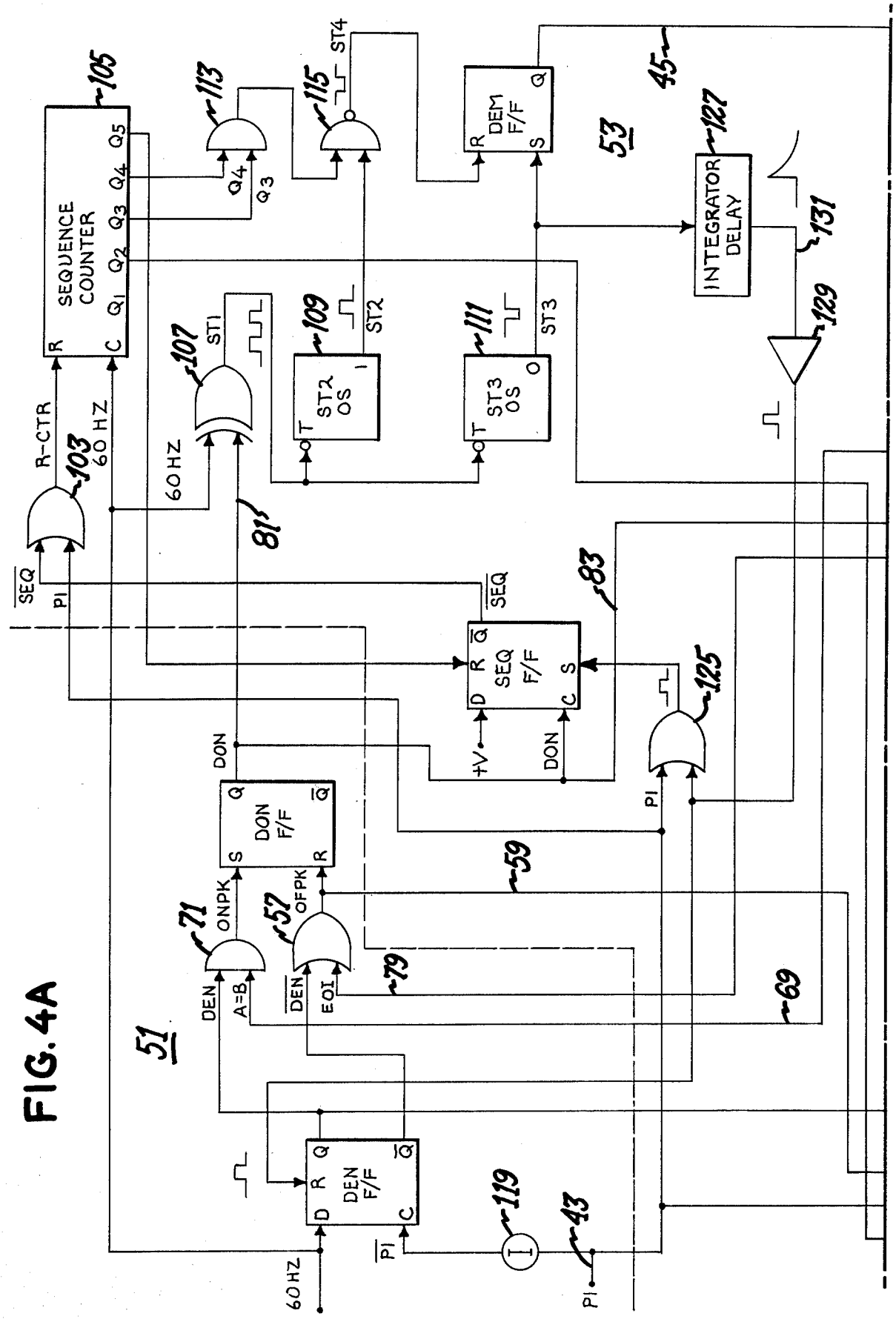
FIG. 4A is a detailed schematic logic diagram of the Demand Enable ON/OFF peak Detector Logic and the Sequencing Logic of FIG. 3.

For a more detailed description of the operation of the invention reference is now made to FIGS. 4, 4A and 4B. The following description will be more readily understood if the schematic diagrams are positioned with their interconnecting lines lined up as shown by FIG. 4.

For purposes of the ensuing description it should be assumed that the time of day demand meter of the present invention is plugged into its operating socket at a consumer residence and that it has been programmed for operation as described in the aforementioned U.S. Pat. No. 4,050,020 and the patent application Ser. No. 724,040.

To understand the operation of the Demand Logic Circuit 15 of FIGS. 4A and 4B, it is first considered advantageous to recognize that that circuit operates during two periods of power usage defined as, (1) on-peak period, and (2) off-peak period. In the preferred embodiment, the Demand Register is engaged only during on-peak periods, and disengaged during off-peak periods. While the invention, for simplicity purposes, will be described in this manner, it is to be understood that these are not imperative limitations of the system. This is due to the fact that the Control Circuit 11 can be programmed to generate the P1 control signal at any time during either a desired on or off-peak period. As such, the Demand Logic Circuit 15 can be enabled during either on or off-peak periods to effect engagement of the clutch controlling the Demand Register dials 17. The only requirement to enable the Demand Logic Circuit to engage the Demand Register is for the P1 and 60 Hz signals be of the proper phase relationship.

In the normal course of operation, a utility meter reader will read the register dials 13, 17 and 19 (FIG. 1) on a monthly basis. After the dials have been read, the meter reader will reset the Demand Logic Circuit 15 so that the the meter can begin to register the amount of demand power that will be consumed in the next monthly period. The Demand Logic Circuit can be reset during either an off-peak period, an on-peak period while a new maximum demand is being set or accumulated on Register 17, or during an on-peak period when a new maximum is not being accumulated on the Register.

Reference is now made to FIGS. 4A and 5. FIG. 5 is a timing diagram showing the major signals for controlling the operation of the Demand Logic 15 when the MR.SW.41 is depressed or activated during an off-peak power period. During an off-peak power period, a demand enable flip flop DEN F/F is in the reset state generating binary 0 and 1 output signals DEN AND $\overline{\text{DEN}}$ respectively. The phase relationships between the P1 and 60 Hz signals for controlling the state of the DEN F/F are not shown in FIG. 5, however, those signals will be described in connection with FIGS. 7A, 7B and 9A–11B.

The binary 1 $\overline{\text{DEN}}$ signal is applied to an OR-gate 57 which is now generating a binary 1 OFPK signal. This latter signal is applied via a conductor 59 to an OR-gate 61 in the Demand Counter Logic 55 of FIG. 4B. As shown by FIG. 5, the OFPK signal enables OR-gate 61 to apply a binary 1 MR1 reset signal to the R terminal of a first or Present Interval Counter 63, thus keeping that counter reset.

When the meter reader activates the MR.SW.41 an MR signal is applied to an R terminal of a second or MAX. Count per Interval Counter 65, thus resetting that counter. As soon as Counter 65 is reset, the contents of both Counters 63 and 65 are detected as being equal by a Comparator 67 receiving the counter outputs at its two sets of input terminals AO-AN and BO-BN. As shown by FIG. 5, the comparator now provides a binary 1 A=B signal on Conductor 69 to an AND-gate 71 of FIG. 4A. The binary 1 A=B signal is now preparing AND-gate 71 to be enabled when the DEN signal goes to a binary 1 during an on-peak period.

It should also be noted at this time, that the binary 1 OFPK signal on Conductor 59 is keeping a demand on flip-flop DON F/F in the reset state and also keeping an Interval Counter 73 reset via two NAND-gates 75 and 77. Resetting the Interval Counter 73 effectuates the generation of a binary 0 End of Interval Signal EOI on a Conductor 79. The EOI Signal is applied as a second input to OR-gate 57, and its purpose will subsequently be described. Also at this time the DON Signal on conductors 81 and 83 is a binary 0, since the DON F/F is reset. The Don Signal is presently preventing Counter 65 from counting the PS pulses by the application of a binary 0 Signal at its enable (E) input terminal. For the present, let it also be accepted that the binary 0 DON Signal is inhibiting any operation of the Sequencing Logic 53, thus preventing engagement of the Demand Register via the Solenoid and Clutch Drive 47.

The operation of the Demand Logic Circuit 15 when the MR.SW.41 is activated during an on-peak period while the Demand Register 17 is being set to a new accumulated value will now be explained in connection with FIG. 6. First it should be recognized that the contents of Counters 63 and 65 are always equal and counting the PS pulses in unison while the Demand Register 17 is engaged recording demand power consumption. The manner in which Counters 63 and 65 achieve equality will subsequently be described. However, it is significant to note at this time that the A=B signal (FIG. 5) is a binary 1 along with the binary 1 DEN signal from the now set DEN F/F. And-gate 71 is thus enabled to apply a binary 1 set ONPK signal to the DON F/F. As shown in FIG. 6, the DON Signal is in a binary 1 state.

Now, as shown in FIG. 6, when the MR.SW.41 is activated the MR1 and MR signals each go to a binary 1 state to reset their respective counters 65 and 63. It should be noted that, since both counters are reset simultaneously, their contents remain equal and thus the A=B signal remains at a binary 1. Resetting the counters of course initializes the Demand Logic Circuit to allow accumulation of the amount of power consumed during the prescribed demand intervals of the next monthly period.

To further understand the operation of the Demand Logic Circuit 15 of the present invention, reference is now made to the Pulse Initiator Logic 39 of FIG. 4B. The purpose of the Pulse Initiator Logic is to continuously provide sync pulses PS during meter operation. The repetition rate or frequency of these pulses is directly proportional to the amount of power being consumed by the system. The Pulse Initiator 39 is comprised of a pair of light emitting diodes 85 and 87 connected in series between a voltage potential +V and ground via a load resistor 89. During meter operation, diodes 85 and 87 continuously illuminate light which impinges on a rotating disc 91 mounted in the time of day demand meter of the present invention. Disc 91 has been fabricated to contain an aperture 93 through which the light from the respective diodes 85 and 87 can pass as the disc aperture(s) rotates past those diodes.

A pair of photo transistors PT1 and PT2 are juxtapositionally alligned with the disc aperture so that the light from the diodes 85 and 87 impinges on the base of their respectively associated transistors as the rotating disc comes into alignment with the respective diodes and transistors. Photo transistors PT1 and PT2 are of the NPN type having their emitters connected in common to ground so that each transistor will conduct to generate a logic 0 signal at its collector as light strikes the base. Each transistor output is applied to a Pulse Sync flip-flop 95 via an associated one of inverters 97 and 99.

Flip-flop 95 is triggered to alternately set and reset by the binary 1 signals from the two inverters as their respectively associated transistors are caused to conduct by the light through the meter disc aperture. The output of the Pulse Sync F/F 95 is an alternating sync Pulse PS having an indeterminate repetition frequency which is proportional to the amount of power being consumed by the system. The PS Pulses are continuously applied to a C or clock input terminal of each of the Counters 63 and 65.

The Demand Counter Logic 55 can best be understood by analyzing the input control signals applied to the reset (R) and enable (E) input terminals of the counters of that circuit. Reference is first made to the Present Interval Counter 63. That counter has its E terminal connected to a binary 1 +V enable potential so that Counter 63 is automatically enabled to count the PS Pulses when the MR1 signal at its R terminal is a binary 0. As previously described, Counter 63 is reset whenever either the OFPK signal is a binary 1 or the MR.SW.41 is activated. Thus, it can be seen that Counter 63 can be reset by the meter reader on a monthly basis. Further, Counter 63 is always reset and prevented from counting by the MR1 binary 1 signal as long as the OFPK signal is present at the input of OR-gate 61. It is significant to realize that the counter 63 always starts to count from zero at the beginning of each demand interval. Thus, its count always represents the amount of power being consumed during the present demand interval. This is clear from observation of OR-gate 57 of FIG. 4A which is enabled during Off-peak periods (DEN F/F reset) and at the end of each demand interval by the EOI signal to cause Counter 63 to reset to zero.

Reference is now made to the Maximum Count per Interval Counter 65. That counter is reset only when the meter reader activates the MR.SW.41. Thus, it can be seen that it will normally be reset only on a monthly basis (ie., after each reading of the meter register dials). Counter 65, except when in the reset state, contains an accumulated count value proportional to the amount of power consumed during the one demand interval of maximum electrical energy consumption. Counter 65 is enabled to count by the DON binary 1 signal. By observing the A=B signal from comparator 67 and AND-gate 71, it can be seen that the A=B signal enables AND-gate 71 to set the DON F/F during an on-peak period (DEN F/F set), The DON F/F is first set to enable Counter 65 to count the PS Pulses at system reset time by the activation of the MR.SW.41. As previously described, the MR.SW.41 resets both counter 63 and 65 causing the A=B signal to go to a binary 1. At the time of reset, if the DEN F/F is set (ON-peak) AND-gate 71 is enabled to set the DON F/F. At this time, since the OFPK signal is a binary 0, both of the Counters 63 and 65 will begin counting the PS Pulses in unison, thus keeping the A=B signal at a binary 1. Counters 63 and 65 will continue to count the PS Pulses until the Control Circuit 11 generates a P1 signal. This latter P1 signal will either reset the DEN F/F to enable OR-gate 57 (system goes to off-peak) or have no affect at all on the DEN F/F. The P1 signal also causes an Interval Pulse F/F 101 to set. When flip flop 101 sets, a 15 minute signal 15 MP is applied to counter 73 causing it to generate the EOI (end of interval) signal which also enables OR-gate 57.

When OR-gate 57 is enabled by either the $\overline{DEN}$ or EOI signals, Counter 63 and the DON F/F are both reset. With Counter 63 now reset, it is conditioned to begin counting from zero at the start of the next demand interval. Since the DON F/F is now reset, the DON signal is a binary 0 disabling Counter 65 from counting the PS Pulses. It should be noted at this time that the A=B signal is now a binary 0 to prevent the DON F/F from again setting until the contents of counters 63 and 65 are equal.

At the termination of the first demand interval following system reset, Counter 65 contains a count proportional to the amount of power used during the first demand interval. As will subsequently be described, the Demand Register 17 also accumulates a reading proportional to the amount of power consumed during the time that Counters 63 and 65 were counting.

Let it now be assumed at a subsequent time the Control Circuit 11 generates a P1 signal which sets the DEN F/F indicating an on-peak period and the start of a second demand interval. With the DEN F/F now set, OR-gate 57 is disabled to cause the OFPK signal to go to a binary 0. The MR1 signal from OR-gate 61 now goes to a binary 0 and the Present Interval Counter 63 begins to count the PS Pulses. The A=B output of the Comparator 67 will remain at a binary 0 so long as the contents of Counter 63 are less than the previously accumulated count in Counter 65.

Now let it be assumed that the demand for power in the present interval exceeds the maximum power consumed in the previous maximum demand interval as manifested by the contents of Counters 65. When this maximum is achieved, the contents of Counters 63 and 65 become equal, thus causing the A=B signal to go to a binary 1. Since the DEN F/F is assumed to be set, AND-gate 71 is now enabled to set the DON F/F. The DON signal now goes to a binary 1 to enable Counter 65 to begin counting in unison with Counter 63. Also at this time, in a manner to be described, the Demand Register 17 is engaged to accumulate the additional amount of power being consumed during the present demand interval.

Counters 63 and 65 will continue to count and the Demand Register will remain engaged until the DON F/F is reset as previously described.

Figure 8A:
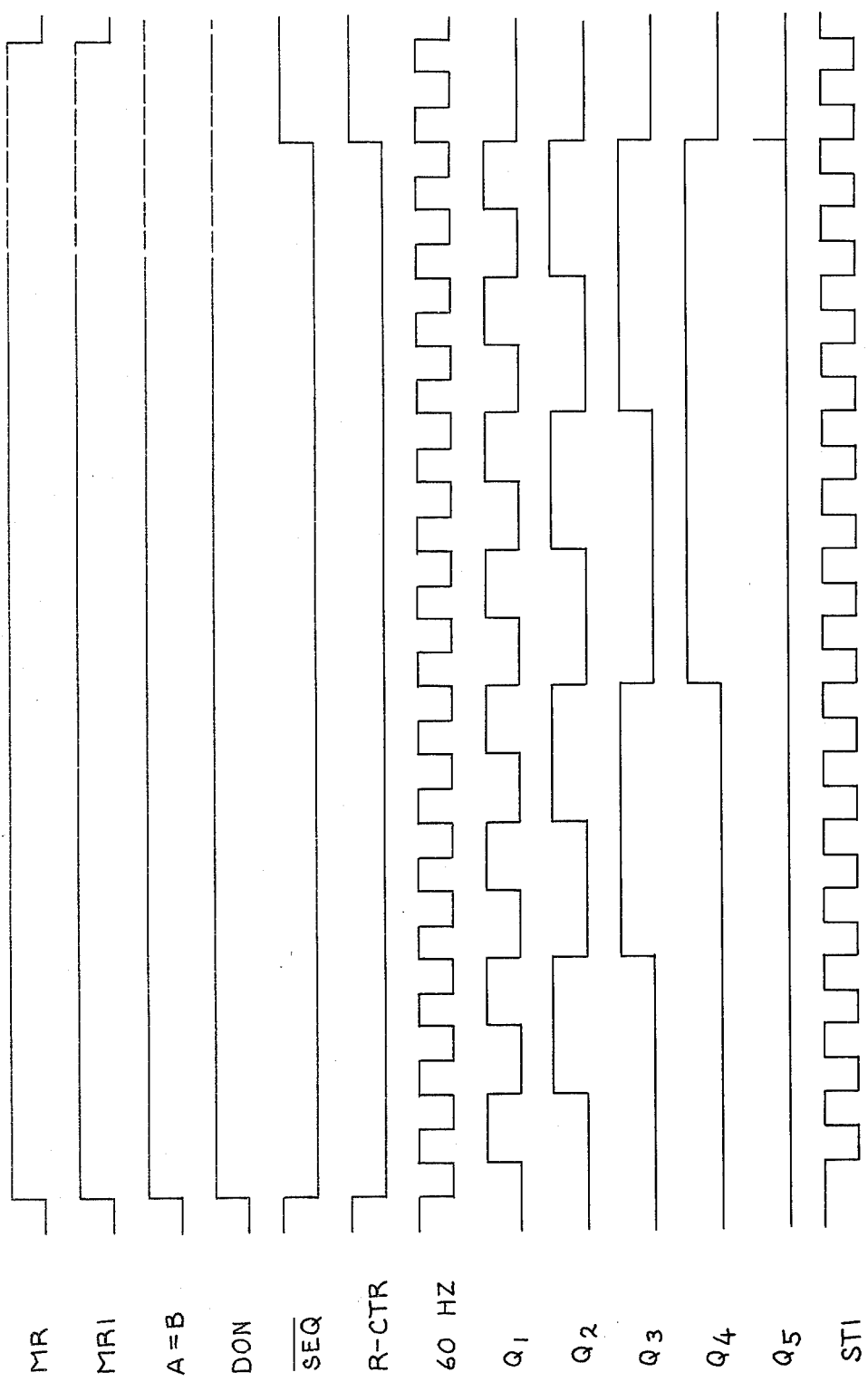

With the preceding background, reference is now made to FIGS. 8A and 8B in conjunction with FIGS. 4A and 4B. FIGS. 8A and 8B illustrate the operational timing of the Demand Logic Circuit 15 to engage the clutch of the Demand Register 17 when the system is operating on-peak, when a new demand is not being set (ie. Demand Register 17 is disengaged) when the MR.SW.41 is activated.

Since the system is assumed to be operating on-peak. the DEN F/F is set. As shown in FIG. 8A activation of the MR.SW.41 causes the MR and MR1 signals to go to a binary 1 resetting both of the Counters 63 and 65. With Counters 63 and 65 reset, and equal, the A=B signal goes to a binary 1 enabling AND-gate 71 and setting the DON F/F as shown by the DON signal going to a binary 1. The DON signal now enables Counter 65 so that both counters can begin counting the PS Pulses as soon as the MR.SW. is opened or deactivated.

Reference is now made to FIG. 4A to a sequence flip flop (SEQ F/F) receiving a +V binary 1 enable input at its D or set input terminal and providing as an output an $\overline{SEQ}$ signal at its $\overline{Q}$ output terminal. As can be seen in FIG. 8A, the DON signal, applied to the C terminal of the SEQ F/F, now going to a binary 1 causes the SEQ F/F to set driving the $\overline{SEQ}$ signal to a binary 0. The $\overline{SEQ}$ signal is applied as one input to an OR-gate 103, with the other input being the P1 Control signal. Since the P1 signal is always a binary 0, except when signalling the Control Circuit 11 to switch from on-peak to off-peak or visa versa, OR-gate 103 is now disabled. The disablement is illustrated in FIG. 8A by a reset counter signal R-CTR going to a binary 0 state.

The R-CTR signal is applied to a reset (R) control terminal of a Sequence Counter 105 of the Sequencing Logic 53. Counter 105 operates to remain in the reset state so long as the R-CTR signal is a binary 1 (ie. it cannot count). However, as soon as the R-CTR signal goes to a binary 0, counter 105 is enabled to count the 60 Hz Pulses from the power supply 21 (FIG. 1) applied to its C or clock input terminal. As can be seen in FIG. 8A, the Sequence Counter 105 operates as a conventional five bit binary counter which is triggered on the rising edge of the 60 Hz pulses to sequentially generate output signals Q2–Q5, with Q1 being shown but not used.

Still referring to FIG. 4A, an Exclusive OR-gate 107 receives the 60 Hz and DON signals to generate a first strobe output signal ST1 at a time as shown in FIG. 8A. As is well known in the art, an exclusive OR-gate generates a binary 0 output when its inputs are equal and generates a binary 1 output only when its inputs are opposite. As such, as can be seen in FIG. 8A, the ST1 signal is a 60 Hz square wave which is 180 degrees out of phase with the 60 Hz pulses.

The ST1 signal is applied simultaneously to an inverter input of each of two delay one shot multivibrators ST2 OS 109 and ST3 OS 111. Each of these delay circuits is triggered on the falling edge of the ST1 signal to generate respective second and third output strobe signals ST2 and ST3. Since the ST2 signal is taken from the 1 output terminal of ST2 OS and the ST3 signal is taken from the 0 output terminal of ST3 OS, these signals are 180 degrees out of phase with respect to each other. This phase relationship is depicted in FIG. 8B, where it should be noted that the Pulse width of the ST3 signal is approximately one-half the pulse width of the ST2 signal.

Referring now back to the output of the Sequence Counter 105, two of that counter's output signals, Q3 and Q4, are applied to an AND-gate 113, which is enabled when those two signals each achieve a binary 1 state. The output of AND-gate 113 is applied to a NAND-gate 115 in conjunction with the ST2 signal from ST2 OS to generate a fourth strobe signal ST4. In the operation of a NAND-gate, its output goes to a binary 1 only when its inputs are opposite or both binary 0's and provides a binary 0 output when its inputs are all binary 1's. The operation of NAND-gate 115 is depicted in FIG. 8B, which shows the ST4 signal being a series of negative going pulses having the same pulse width as the ST2 signal and which occur each time the ST2 signal and the output of AND-gate 113 are both binary 1's.

A Demand flip flop, DEM F/F receives the ST4 signal at its reset (R) terminal and the ST3 signal at its set (S) input terminal. As can be seen in FIG. 8B, the DEM F/F is triggered to set and reset on the rising edge of the ST3 and ST4 pulses respectively to generate a positive going Demand output pulse DEM having a pulse width approximately half the pulse width of the ST4 pulse.

The DEM pulse is applied to a Clutch Solenoid Drive (Triac) 117 of the Meter Register Solenoid and Clutch Drive 47 (See FIG. 3). The Solenoid Drive Circuit 117 is comprised of the aforementioned transistor 73 and triac 69 of U.S. Pat. No. 4,050,020 (FIG. 5), and as such is depicted here as a block representative of that circuit.

The output of the Solenoid Drive 117 is a Clutch Drive signal similar in characteristics to the DEM signal and is utilized to drive the Clutch and Solenoid Coil 59 of U.S. Pat. No. 4,050,020. The 60 Hz pulses are also applied to the Solenoid Coil 59.

As previously described, and as disclosed in the aforementioned U.S. Pat. No. 4,050,020, when the Clutch Drive or DEM signal is in phase with the system 60 Hz signal from power supply 21, the clutch is engaged to drive the Demand Register dials 17 and thus record the amount of power being consumed during the present demand interval. As can be seen in FIGS. 8A and 8B, the DEM and 60 Hz signals are in phase to thus engage the clutch of the Demand Register 17. It should be noted, in FIG. 8B, while the DEM signal is shown as a series of four pulses, only one pulse need be generated to engage the clutch. In the preferred embodiment, however, it is preferred to pulse the clutch four times just to insure that the clutch engages.

Reference is now made back to the Q5 output of the Sequence Counter 105 of FIG. 4A and to the Q5 signal of FIG. 8A. As shown in those figures, when the Q5 stage of Counter 105 is set a binary 1 a Q5 pulse is applied to a reset (R) terminal of the SEQ F/F causing the SEQ signal to now go to a binary 1. The $\overline{SEQ}$ signal now enables OR-gate 103 allowing the R-CTR signal to reset counter 105. Counter 105 will remain reset until the SEQ F/F is again set. It should also be noted in the reset operation just described, that the INTVL Pulse F/F 101 of FIG. 4B is reset by the Q2 pulse applied to the R input terminal of that flip flop. Flip flop 101 is reset in preparation to generate the 15 MP signal for the Interval Counter upon receipt of the next P1 signal during either, (1) an end of demand interval while on-peak, (2) when the system is directed to Off-peak by the P1 signal, or (3) when the system is directed to on-peak after monthly reset. The Q2 signal is also applied to NAND-gate 75, however, it has no further effect on the system at this time.

Figure 7A:
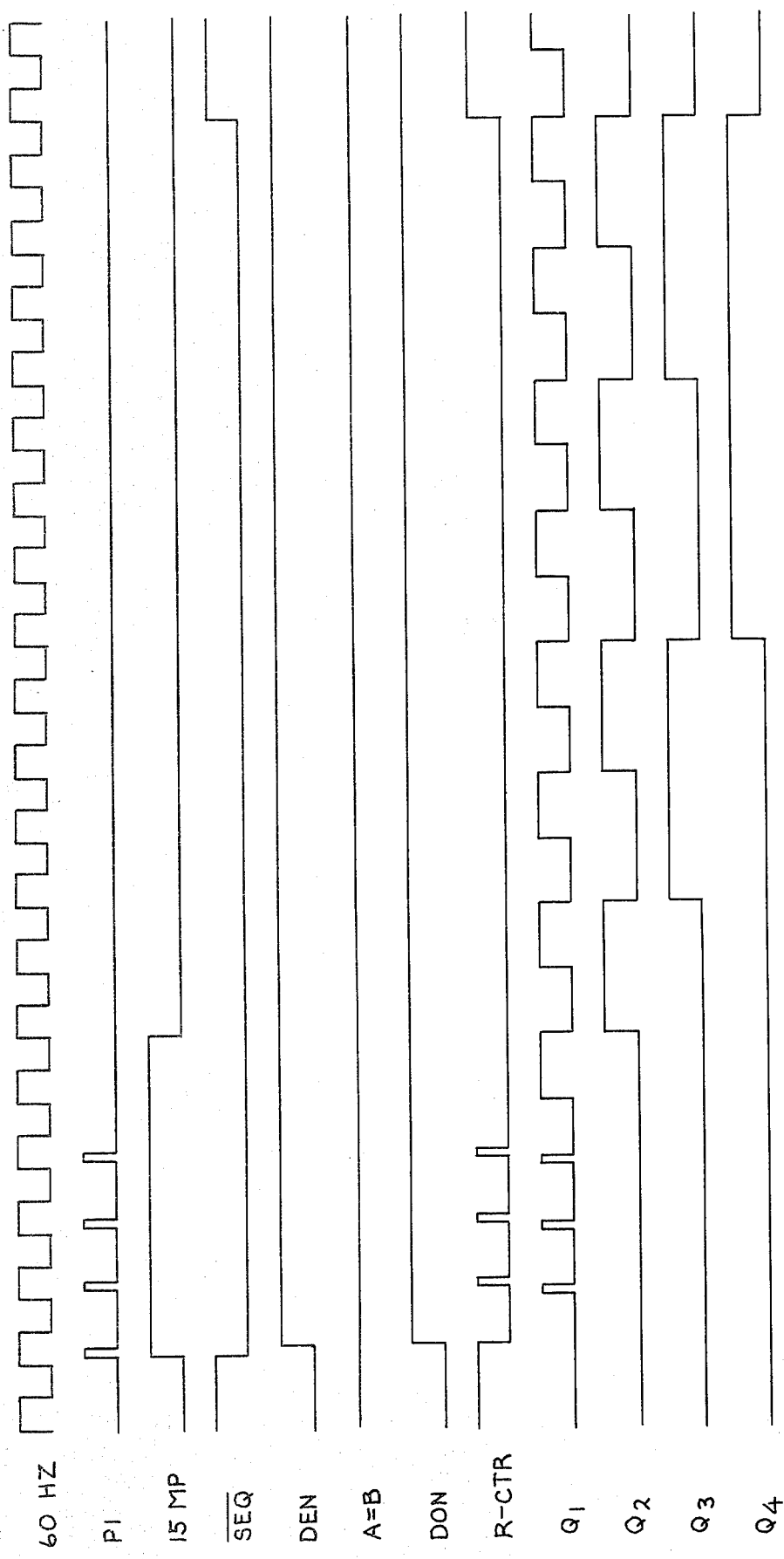
FIGS. 7-11 are legendary drawings showing the inter-relationships between their respectively associated drawings 7A-11B when positioned as illustrated.

Reference is now made to FIGS. 7A and 7B which illustrate the timing of the Demand Logic Circuit of FIGS. 4A and 4B when the system is directed to on-peak to start a demand interval after monthly reset caused by activation of the MR.SW.41.

As shown in FIG. 7A, the P1 signal is a series of four pulses each occuring in phase with the 60 Hz pulses from power supply 21. As previously explained, when the system is operating off-peak, the DEN F/F of FIG. 4A is reset. FIG. 7A shows how the DEN F/F is set by the P1 and 60 Hz signals to command the Logic Circuit 15 to go on-peak for registering on Demand Register 17. The P1 signal is applied to an Inverter 119 and inverted to a $\overline{P1}$ signal at the clock (C) input of the DEN F/F. The 60 Hz signal is applied simultaneously to the set/reset D input of the DEN F/F. The DEN F/F is triggered on the positive edge of its C input, and this is illustrated by FIG. 7A showing that flip flop setting on the trailing edge of the P1 signal when it goes negative to apply a binary 1 $\overline{P1}$ signal to the DEN F/F causing it to set in response to the binary 1 60 Hz pulses now present at the D input.

The P1 signal is also applied to the set (S) input terminal of the INTV1. PULSE F/F 101, causing the flip flop to set generating the 15 MP signal at the time shown in FIG. 7A. The 15 MP signal has no affect on the Interval Counter 73 at this time, because it can be triggered only on the rising edge of the 15 MP pulse, which, in this instance, occurs prior to the DEN signal going to a binary 1. As such, the output of NAND-gate 77 goes to a binary 0 after the 15 MP signal and Counter 73 is unaffected by the 15 MP signal.

Referring back to FIG. 4A, the P1 signal is further applied to a set (S) input terminal of the SEQ F/F via an OR-gate 125 causing that flip flop to set making the SEQ signal go to a binary 0 as shown in FIG. 7A. The $\overline{SEQ}$ signal is applied to one input of OR-gate 103, thus removing the constant R-CTR binary 1 reset signal from the Sequence Counter 105. The OR-gate 103 is now enabled to allow the P1 signal to control the reset operation of Counter 105. Just how P1 affects the operation of the Sequence Counter will subsequently be described. For the moment, however, reference is now made to the AND-gate 71 of FIG. 4A.

AND-gate 71 receives the two input signals DEN and A=B. The A=B signal is now a binary 1 as shown in FIG. 7A. It will be recalled that the signal A=B always goes to a binary 1 when Counters 63 and 65 (FIG. 4B) are reset by the MR1 and MR signals at system reset time. Now, as shown in FIG. 7A, when the DEN F/F is set, AND-gate 71 is enabled to apply a binary 1 ONPK signal to the S input of the DON F/F. The DON F/F is thus set to generate the binary 1 DON signal at the time shown in FIG. 7A. As previously described, the DON signal now enables Counter 65 to begin counting the PS pulses in conjunction with Counter 63. The DON signal is also applied to the S input terminal of the SEQ F/F, however, in this instance it has no affect on that flip flop as it was previously set by the P1 signal. The reset signal was removed from Counter 63 when the OFPK signal went to a binary 0 with the setting of the DEN F/F.

Reference is now made back to the R-CTR output signal of OR-gate 103 of FIG. 4A and to that signal as shown in FIG. 7A. Attention is now called to the Q1 signal of Counter 105 as shown in FIG. 7A. As shown in that figure, the Q1 stage of Counter 105 is set on the rising or leading edge of the 60 Hz signal applied to the C input of that Counter and then immediately reset by the rising edge of the R-CTR signal resulting from the P1 signal passing through OR-gate 103. As shown in FIG. 7A, the Q1 stage of Counter 105 is set and reset three times in response to the three R-CTR signals (P1 passing through OR-gate 103).

After the last R-CTR pulse (also last P1 pulse) has been generated, OR-gate 103 is disabled to now allow Counter 105 to count the 60 Hz pulses generating the Q1-Q5 output signals as shown in FIGS. 7A and 7B.

The ST1-ST4 signals are generated as shown in FIG. 7B in the manner previously described in connection with FIGS. 8A and 8B. Also, the DEM signal is generated in FIG. 7B to engage the Demand Register 17 in the same manner as described for FIGS. 8A and 8B.

Let it now be assumed that the system is operating during a demand interval (on-peak) and that the Programmable Control Circuit 11 of FIG. 1 generates a P1 signal to terminate or end that interval while retaining the system on-peak. The timing for this termination is shown by FIGS. 9A and 9B.

Figure 9A:
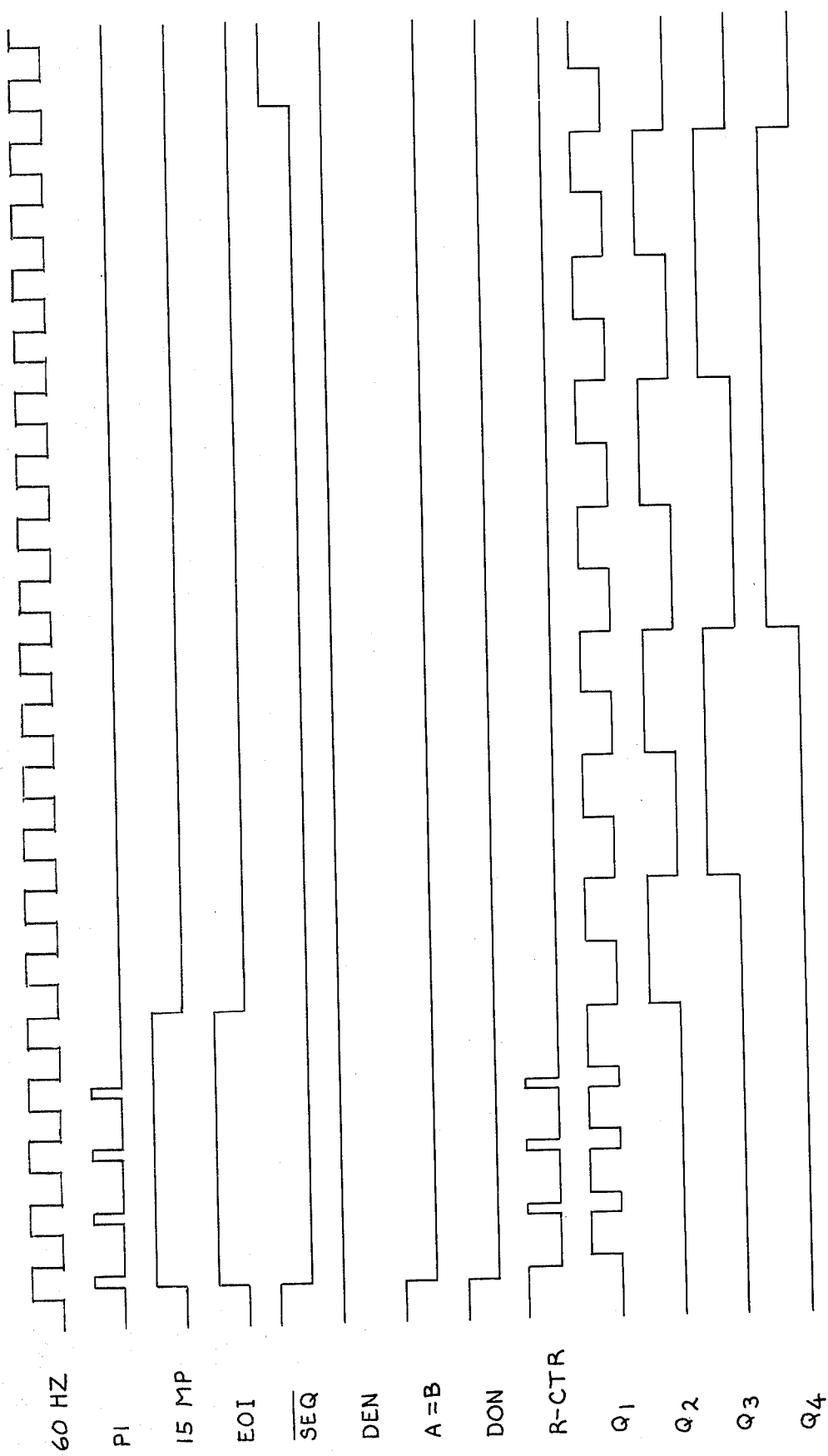
Figures 9, 9B:
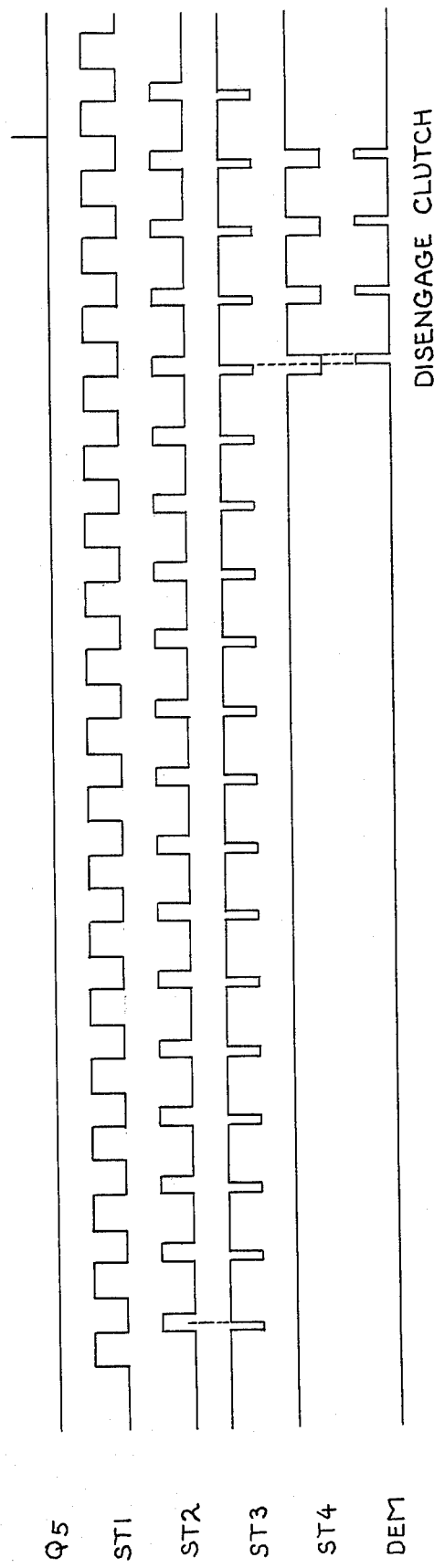

As shown in FIG. 9A, the p1 signal occurs in-phase with the 60 hz signal and since the DEN F/F is already set (on-peak), the state of that flip flop is not changed. However, note at this time that the P1 signal sets the INTVL Pulse F/F 101 of FIG. 4B to generate the 15 MP pulse which triggers the Interval Counter 73 to generate the end of interval (EOI) pulse on conductor 79. Counter 73 is enabled to count in this particular instance because of the binary 1 DEN signal at NAND-gate 77 disabling that gate to apply a binary 0 nonreset signal to Counter 73.

At this point it is considered informative to more thoroughly describe the purpose of the Interval Counter 73. In the present invention, it is desirable to program the Time Interval Counter/Logic 49 to generate an EOI signal every fifteen minutes. However, this is not a limitation of this circuit. It can also be programmed to generate the EOI signal at other intervals (eg. every 30, 60, 120, etc. minute intervals). There are instances where the utility may want their demand interval to be of a longer duration than fifteen minutes. In which case, it is desirable to generate the EOI signal at some other interval than every fifteen minutes.

By observation of the jumper pin connector outputs of Counter 73, it can be seen that if the jumper 123 is connected to the 15 minute output, one EOI signal will be generated for each 15 MP pulse, thus causing 15 minute Demand intervals. If a 60 minute Demand interval is desired, jumper 123 is moved to the 60 minute (Q3) output and the Counter 73 will have to count four 15 MP pulses in order to generate one EOI output signal. Thus, for one P1 signal every fifteen minutes, it would take one hour for the Counter 73 to generate the EOI signal to terminate the present demand interval.

It is well known in the art that the conventional way of expressing the rate of energy consumption is in kilowatts. However, in the present invention, the Demand Register 17 is made to register the rate of energy consumption in kilowatt-hours/interval. That register reading, however, can easily be converted to kilowatts by the utility company for their use in billing the customer. This manner of conversion will be explained in the following text.

In the present invention, if certain rules are adhered to, the demand interval length can be changed by changing the jumper 123 to the various outputs of Counter 73 and the Demand Register 17 will properly display kilowatt hours/interval. This is explained as follows.

If it is assumed that the jumper 123 is connected to Counter 73 for a 60 minute (1 hour) demand interval, the Demand Register 17 will provide an actual reading of kilowatt hours/interval. Because it is a one hour interval, this reading is also equal to kilowatts. However, assume that the jumper 123 is connected for a 30 minute interval. The Demand Register will read the actual kilowatt-hours/interval as just described, however, since the interval is for ½ hour and to convert that reading to kilowatts to represent demand, it is necessary to divide that reading by ½ hour. This is what the utility company does when figuring out the customer's bill.

Utilizing the same rule, it can be seen that when the jumper 123 is connected to the 15 minute interval output of Counter 73, the actual Demand Register reading should be divided by ¼ hour. In a similar manner, if a 2 hour demand interval is selected by connecting the jumper 123 to the 120 minute interval output of Counter 73, the Demand Register reading should be divided by 2 hours to get the kilowatt demand reading for a 2 hour interval. If the 240 minute demand interval is selected, the actual Demand Register reading should be divided by 4 hours.

It is possible to have the Demand Register to read in kilowatts for any demand interval if the register gear ratio is changed each time the jumper 123 is placed on a different output of Counter 73. Discounting any stepped up gear ratio in the Demand Register to increase its resolution, the manner in which these various gear ratios can be calculated for the several lengths of demand intervals is explained in the following example.

It is understandable that—if in a maximum demand interval of 15 minutes, x kilowatt-hours is consumed, the maximum average kilowatt demand is, x kilowatt-hours divided by ¼ hour=4 x kilowatts. Thus, a 4:1 step up gear ratio is required in the Demand Register 17 when a 15 minute demand interval is selected.

The various other gear ratios can be figured out in the above manner for selecting the 30, 60, 120 and 240 minute demand interals on Counter 73.

From the proceding, it can now be seen that the Interval Counter 73 and its various jumper outputs provide an economical and advantageous way of readily changing the demand interval length in a demand meter register without having to make special mechanical gear ratio changes in the register to accommodate the several lengths of demand intervals.

It is also significant to note that the jumper 123 can be eliminated from the outputs of Counter 73. This in essence, removes the counter circuitry from the demand logic circuit, in which case the EOI signal will be generated and the demand interval length will then be equal to total on-peak time. In this case, the kilowatt-hours-/interval registered on the Demand Register will be correct, because the interval length is the total of the on-peak time.

Now referring back to the EOI signal of FIGS. 9A, 4A and 4B, it will be noted that that signal now enables OR-gate 57 to generate a binary 1 OFPK signal resetting the DON F/F at the time shown in FIG. 9A. The OFPK signal has no affect on the operation of NAND-gate 75 at this time, and thus no affect on the operation of Counter 73. However, the OFPK signal now enables OR-gate 61 to apply a binary 1 MR1 reset signal to the Present Interval Counter 63. The MR1 signal now resets counter 63, having the effect of causing the A=B signal to go to a binary 0 at the time shown in FIG. 9A. This is due to the fact that the contents of Counters 63 and 65 are no longer equal.

With reference now to AND-gate 71 of FIG. 4A, it can be seen that the gate is disabled by the A=B binary 0 signal at the same time the EOI signal resets the DON F/F via OR-gate 57. It should also be noted that the binary 0 DON signal on Conductor 83 now disables Counter 65 from counting the PS pulses until again enabled at the next demand interval.

The Q1-Q5 and ST1-ST4 signals are generated in the same manner as previously described, with the exception that the ST1 signal is now out of phase with the 60 Hz signal. This is due to the fact that the DON signal at the input to the Exclusive OR-gate 107 is a binary 0, thus reversing the polarity of operation of that gate. It is this out of phase relationship of the ST1 and 60 Hz signals which allows the clutch solenoid of Demand Register 17 to be disengaged as shown in FIG. 9B. By comparing the DEM signal with the 60 Hz signal of FIGS. 9A and 9B applied to the Solenoid Coil 59 of FIG. 4B it can be seen that those two signals are out of phase to disengage the clutch.

It should also be noted that the Q2 binary 1 output signal from Counter 105 in conjunction with the binary 1 OFPK signal (EOI is a binary 1) enables NAND-gate 75 to apply a binary 0 signal to NAND-gate 77, which in turn applies a binary 1 reset signal to Counter 73, thus terminating the EOI signal. The Q2 signal also resets the INTVL.PULSE F/F 101 at the same time, terminating the 15 MP signal as shown in FIG. 9A.

Figure 10A:
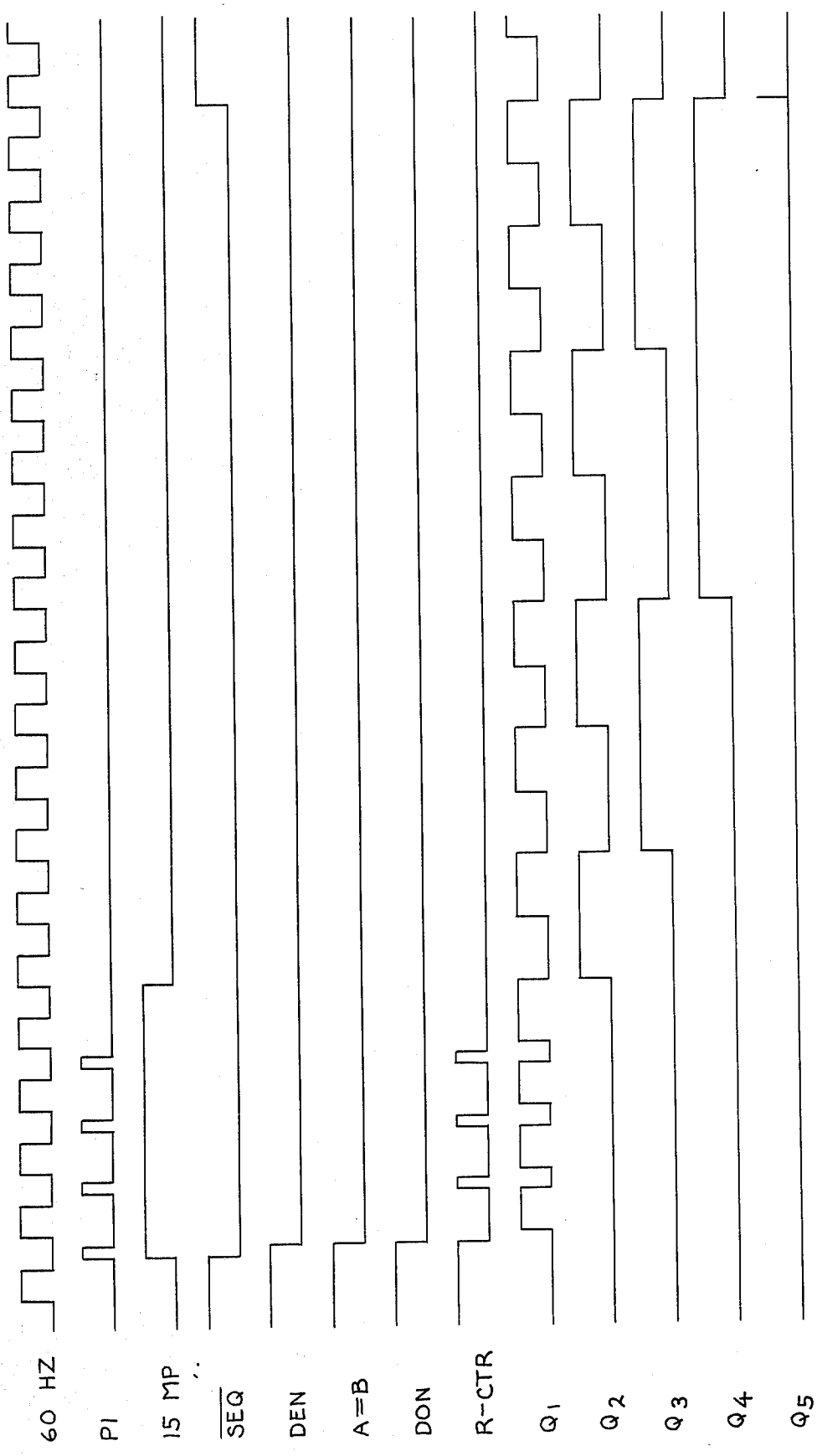

To understand the operation of the Demand Logic Circuit 15 of the present invention when the system is commanded to go to off-peak by the P1 signal from Control Circuit 11, reference is now made to the off-peak timing diagram of FIGS. 10A and 10B. As can be seen in FIG. 10A, the P1 and 60 Hz signals are now out of phase, causing the DEN F/F to reset on the trailing edge of the P1 Pulse. The DEN signal thus goes negative disabling AND-gate 71 and the DEN signal goes to a binary 1 resetting the DON F/F via OR-gate 57.

The SEQ F/F is set via OR-gate 125 as previously described to enable Counter 105 to count the 60 Hz pulses and Counter 63 is reset by the OFPK signal via OR-gate 61. Additionally, Counter 65 is disabled from counting the PS Pulses by the binary 0 DON signal. As shown in FIGS. 10A and 10B, the Sequence Counter will generate the Q1-Q5, ST1-ST4 and DEM signals to disengage the Demand Register Clutch in the same manner as described for FIGS. 9A and 9B.

Figure 11A:
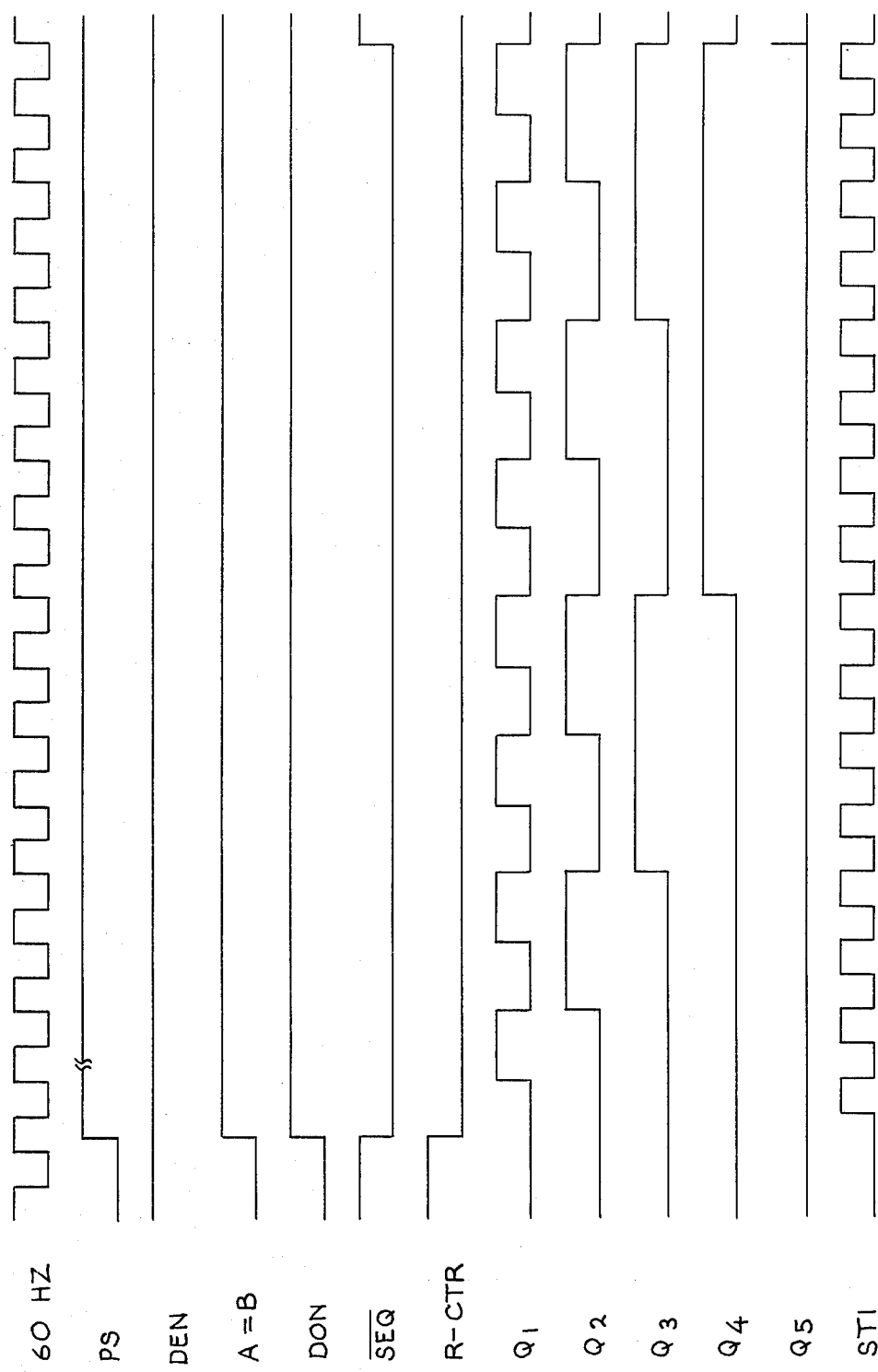
Figure 11B:
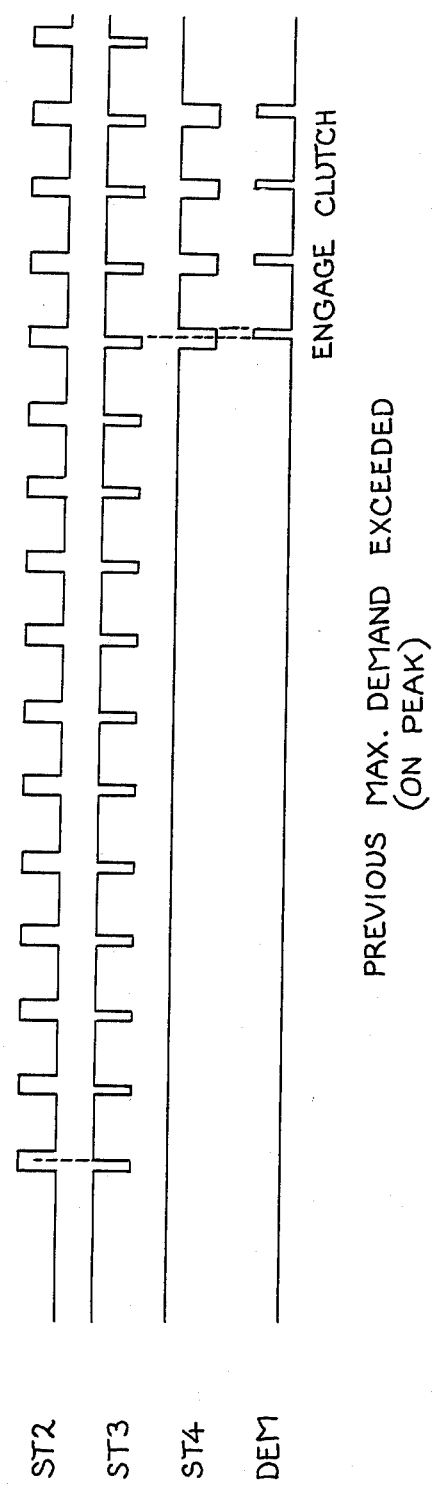
Figure 11:
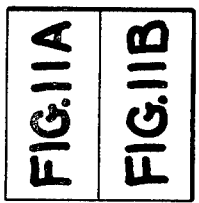

Let it now be assumed that the system is operating during a demand interval (normally ON-peak with the DEN F/F set) and that the one previous demand interval of maximum power consumption is exceeded in this demand interval. FIGS. 11A and 11B show the timing of the Demand Logic Circuit of FIGS. 4A and 4B for energizing or engaging the Demand Register Clutch when this maximum is exceeded.

As shown in FIG. 11A the DEN signal is a binary 1, thus allowing AND-gate 71 to be enabled when the A=B signal achieves a binary 1. In FIG. 11A only that one PS pulse going from binary 0 to binary 1 is shown that triggers Counter 63 to equal the count in Counter 65. With Counters 63 and 65 now equal, the A=B signal goes to a binary 1, enabling AND-gate 71 and thus setting the DON F/F. This timing is shown in FIG. 11A where the DON signal now achieves a binary 1 state to enable Counter 65 to begin counting the PS pulses in unison with Counter 63. The DON signal also sets the SEQ F/F to enable Counter 105 to count the 60 Hz pulses and further condition the Exclusive OR-gate 107 to generate the ST1-ST4 signals at the proper time so that the DEM signal is generated in phase with the 60 Hz signal to engage the Solenoid Coil 59 of FIG. 4B to drive the Demand Register 17.

The Demand Register will now continue to accumulate the excess amount of power being consumed in the present demand interval until the Demand Logic Circuit is commanded to either go off-peak or end the present demand interval. At the end of the present or last demand interval, the Demand Register 17 will contain a reading of the amount of electrical energy consumed during the one demand interval, out of all demand intervals, of maximum electrical energy consumption. Further, at the termination of the present or last demand interval, the Max. Count per Interval Counter 65 will contain a count or value proportional to that amount of energy manifested by the Demand Register dials.

While the Demand Logic Circuit 15 of the present invention has been disclosed in a purely digital embodiment, it is to be understood that at least portions of that circuit could be implemented in an analog embodiment. For example, the Pulse Initiator 29 could be constructed of an electronic or magnetic sensor which generates an integrated variable analog output signal or value proportional in amplitude to the amount of energy being consumed by the system.

The Counters 63 and 65 and Comparator 67 can be replaced by their analog equivalents. Amplifiers 63 and 65 for example, may each comprise controllable long term storage accumulator type integrating amplifiers which are controlled similar to Counters 63 and 65 to increase their outputs only when the analog input to each is greater than the value presently stored in each amplifier. When the values of each of the analog amplifiers achieve equality, the analog comparator would generate a signal similar to the A=B signal to effect enablement of the Clutch and Solenoid Coil 59 of FIG. 4B.

The invention also includes means for inhibiting operation of the Demand Logic Circuit 15 in the event of a power failure. Referring to FIG. 4A there is shown a conventional RC Integrator Delay network 127 receiving the ST3 OS. As can be seen from the timing diagrams and FIG. 4A, the ST3 signal is continuously generated so long as the 60 Hz signal is present at the input to gate 107. So long as the ST3 signal is continuously applied to the Integrator 127 its output, to a conventional squaring amplifier 129, remains at a constant negative or binary 0 potential. However, in the event of a power failure which lasts for example for five or more seconds, the Integrator generates an output pulse to amplifier 129 similar to that shown on Conductor 131. The input Pulse to amplifier 129 is applied as a binary 1 squared off pulse to a reset R terminal of the DEN F/F and also as a set pulse to the S input terminal of the SEQ F/F via OR-gate 125.

Resetting the DEN F/F takes the system out of the demand interval mode to reset the DON F/F via OR-gate 57, while setting the SEQ F/F disables OR-gate 103 so that upon restoration of power, which in turn effects the generation of the DEM signal to disengage the clutch in the manner as previously described. It should be recalled as previously described and as disclosed in the aforementioned U.S. Pat. No. 4,050,020, the time of day demand meter of the present invention includes a back up battery power supply and auxiliary frequency generator which automatically comes on line to operate the meter circuits in the event of a power failure.

While the present invention has been disclosed in connection with a preferred embodiment thereof, it should be understood that there may be other embodiments which fall within the spirit and scope of the invention as defined by the appended claims.

What I claim as new and desire to secure by Letters Patent of the United States is:

1. A time-of-day demand metering system for registering the amount of electrical energy consumed during demand intervals comprising:
    (a) selectively engageable means for registering the mount of electrical energy being consumed during said demand intervals;
    (b) means for periodically generating electrical pulses having a repetition frequency proportional to the amount of electrical energy being consumed by said time-of-day demand metering system;
    (c) means for generating a control signal at prescribed intervals;
    (d) means responsive, in a first instance, to said control signal for generating an end of interval signal and responsive, in a second instance, to said control signal and to a comparison signal for generating a demand interval on signal;
    (e) means for controlling, during each demand interval, when the registering of the amount of electrical energy being consumed may take place, said means for controlling including,
        (1) comparator means for generating said comparison signal,
        (2) first and second counter means, each receiving said electrical pulses and each having output terminals connected to said comparator means for providing count signals thereto, said first counter means being set to a predetermined count in response to said end of interval signal and being enabled to count said electrical pulses during each demand interval in the absence of said end of interval signal, said second counter means, in response to said demand interval on signal, being enabled to count said electrical pulses during each demand interval when the contents of said first and second counter means are at least equal as detected by said comparator means generating said comparison signal, whereby the contents of said second counter means manifests a magnitude proportional to the amount of electrical energy consumed in a first demand interval plus that excess amount of electrical energy consumed in each subsequent demand interval in which the amount of electrical energy consumed is greater than the amount consumed in the one previous demand interval of maximum electrical energy consumption; and
    (f) means responsive to said demand interval on signal to selectively engage and disengage said means for registering, whereby said means for registering registers the amount of electrical energy consumed during that one demand interval of maximum electrical consumption as controlled by said comparison signal applied to the means for generating said demand interval of signal during said second instance.

2. The time-of-day demand metering system as recited in claim 1, wherein said means for generating said electrical pulses comprises a photo-electric pulse generator for generating said electrical pulses.

3. The time-of-day demand metering system as recited in claim 1 wherein said means responsive to said control signal comprises a demand enable flip flop responsive to said control signal for generating a demand enable signal defining the beginning of a demand interval, a demand flip flop for generating said demand interval on signal, means for setting said demand flip flop to generate said demand interval on signal in response to said comparison signal and the presence of said demand enable signal to effect the engagement of said means for registering, means for applying said end of interval signal to said demand flip flop to effect the resetting thereof, and means responsive to a prescribed number of said control signals for generating said end of interval signal to thereby reset said demand flip flop to cause said demand interval on signal to effect disengagement of said means for registering.

4. The time-of-day demand metering system as recited in claim 3 wherein said system further includes a power source for generating an alternating current signal, with said control signal selectively occuring at a specified point in time to establish a prescribed phase relationship with said alternating current signal to define an on-peak power period of said system and the beginning of a demand interval, said demand enable flip flop receiving said alternating current signal in conjunction with said control signal to set said demand enable flip flop to generate said demand enable signal when said alternating current and control signals are of said prescribed phase relationship, said demand enable flip flop being reset to define an off-peak power period to effect disengagement of said means for registering when said alternating current and control signals are of a second prescribed phase relationship.

5. A time-of-day demand metering system for registering the amount of electrical energy consumed during demand intervals comprising:
 (a) selectively engageable means for registering the amount of electrical energy being consumed during said demand intervals;
 (b) means for periodically generating electrical pulses having a repetition frequency proportional to the amount of electrical energy being consumed by said time-of-day demand metering system;
 (c) means for generating a control signal at prescribed intervals;
 (d) means responsive, in a first instance, to said control signal for generating an end of interval signal and responsive, in a second instance, to said control signal and to a comparison signal for generating a demand interval on signal;
 (e) means for controlling, during each demand interval, when the registering of the amount of electrical energy being consumed is to take place, said means for controlling including,
  (1) comparator means for generating said comparison signal,
  (2) first and second counter means, each receiving said electrical pulses and each having output terminals connected to said comparator means for providing count signals thereto, said first counter means being set to a predetermined count in response to said end of interval signal and being enabled to count said electrical pulses during each demand interval in the absence of said end of interval signal, said second counter means, in response to said demand interval on signal, being enabled to count said electrical pulses during each demand interval when the contents of said first and second counter means are at least equal as detected by said comparator means generating said comparison signal, whereby the contents of said second counter means manifests a magnitude proportional to the amount of electrical energy consumed in that one demand interval of maximum electrical energy consumption; and
 (f) means responsive to said demand interval on signal to selectively engage and disengage said means for registering, whereby said means for registering registers the amount of electrical energy consumed during that one demand interval of maximum electrical energy consumption as controlled by said comparison signal applied to the means for generating said demand interval on signal during said second instance.

6. A time-of-day demand metering system for registering the amount of electrical energy consumed during demand intervals comprising:
 (a) selectively engageable means for registering the amount of electrical energy being consumed during said demand intervals;
 (b) means for generating an energy consumption signal representative of the amount of electrical energy being consumed by said time-of-day demand metering system;
 (c) means for generating a control signal at prescribed intervals;
 (d) means responsive, in a first instance, to said control signal for generating an end of interval signal and responsive, in a second instance, to said control signal and to a comparison signal for generating a demand interval on signal;
 (e) means for controlling, during each demand interval, when the registering of the amount of electrical energy being consumed is to take place, said means for controlling including,
  (1) comparator means for generating said comparison signal,
  (2) first and second means, each receiving said energy consumption signal for accumulatively monitoring the amount of consumed electrical energy and each being connected to said comparator means to provide corresponding values to said comparator means proportional to the amount of consumed electrical energy, said first means being set to a prescribed value in response to said end of interval signal and being enabled to monitor said energy consumption signal to respondingly change its value in the absence of said end of interval signal, said second means, in response to said demand interval on signal, being enabled to monitor said energy consumption signal during each demand interval when the magnitudes of the values of said first and second means are at least equal as detected by said comparator means generating said comparison signal, whereby the value of said second means manifests a magnitude proportional to the amount of electrical energy consumed in that one demand interval of maximum electrical energy consumption; and
 (f) means responsive to said demand interval on signal to selectively engage and disengage said means for registering whereby said means for registering registers the amount of electrical energy consumed during that one demand interval of maximum electrical energy consumption as controlled by said comparison signal applied to the means for generating said demand interval on signal during said second instance.

7. A time-of-day demand metering system for registering the amount of electrical energy consumed during preselected demand intervals comprising:
 (a) selectively engageable means for registering the amount of electrical energy being consumed during said demand intervals;
 (b) means for periodically generating electrical pulses having a repetition frequency proportional to the amount of electrical energy being consumed by said time-of-day demand metering system;
 (c) means for generating a control signal at prescribed intervals defining on and off peak power periods;
 (d) on/off peak detector means responsive, in a first instance, to said control signal defining an off-peak power period for generating an off-peak signal and responsive, in a second instance, to said control signal defining an on-peak power period and to a comparison signal for generating a demand interval on signal, said on/off peak detector means further responsive, in a third instance, to an end of interval signal defining the end of a demand interval to effect the generation of said off-peak signal;
 (e) interval counter means responsive, in said third instance, to said control signal during an on-peak power period for providing said end of interval signal to said on/off peak detector means to effect the generation of said off-peak signal;

(f) demand interval means for controlling, during each demand interval, when the registering of the amount of electrical energy being consumed is to take place, said demand interval means including,
  (1) comparator means for generating said comparison signal,
  (2) first and second counter means, each receiving said electrical pulses and each having output terminals connected to said comparator means for providing count signals thereto, said first counter means receiving said off-peak signal and responding thereto to remain in a reset state during the presence of said off-peak signal and being enabled to count said electrical pulses in the absence of said off-peak signal, said second counter means, in response to said demand interval on signal, being enabled to count said electrical pulses during each demand interval when the contents of said first and second counter means are at least equal as detected by said comparator means generating said comparison signal, whereby the contents of said second counter means manifests a magnitude proportional to the amount of electrical energy consumed in that one demand interval of maximum electrical consumption; and
(g) means responsive to said demand interval on signal to selectively engage and disengage said means for registering in accordance with said end of interval signal applied to said on/off peak detector means, whereby said means for registering registers the amount of electrical energy consumed during that one demand interval of maximum electrical energy consumption.

8. In a power system of the alternating current type, a time of day demand meter for registering the amount of electrical energy consumed by the system during preselected demand intervals comprising:
(a) selectively engageable means for registering the amount of electrical energy being consumed during said demand intervals;
(b) means for generating electrical pulses having a repetition frequency proportional to the amount of electrical energy being consumed by said power system;
(c) means for generating a control signal at prescribed intervals which is either in or out of phase with the system alternating current during said prescribed intervals;
(d) interval counter means responsive to said control signal for generating an end of interval signal defining the end of a demand interval after counting a prescribed number of said control signals;
(e) an on/off peak detector including,
  (1) first detector means capable of achieving first and second states, said first detector means responsive to said control signal and the system alternating current to achieve said first and second states in accordance with the in and out of phase relationships respectively between said control signal and the system alternating current, said first detector means generating a demand enable signal representative of on and off-peak power period when in said first and second states respectively,
  (2) second detector means capable of achieving first and second states for generating a demand interval signal in accordance with the states thereof, said second detector means including means for setting said second detector means to said first state during an on-peak power period in response to said demand enable signal and a comparison signal, and generating an off-peak signal to set said second detector means to said second state during an off-peak power period in response to said demand enable signal, or during an on-peak power period in response to said end of interval signal;
(f) demand interval means for controlling, during each demand interval, when the registering of the amount of electrical energy being consumed is to take place, said demand interval means including,
  (1) comparator means for generating said comparison signal,
  (2) first and second counter means, each receiving said electrical pulses and each having output terminals connected to said comparator means for providing count signals thereto, said first counter means being held in a reset state by said off-peak signal and enabled to count said electrical pulses in the absence of said off-peak signal, said second counter means, in response to said demand interval signal, being enabled to count said electrical pulses during each demand interval of an on-peak power period when the contents of said first and second counter means are at least equal as detected by said comparator means generating said comparison signal, whereby the contents of said second counter means manifests a magnitude proportional to the amount of electrical energy consumed in that one demand interval of maximum electrical energy consumption; and
(g) means responsive to said demand interval signal for selectively engaging and disengaging said means for registering in accordance with said end of interval signal applied to said second detector means whereby said means for registering registers the amount of electrical energy consumed during that one demand interval of maximum electrical energy consumption.

9. In a time-of-day demand metering system, a method of registering the amount of electrical energy consumed during demand intervals comprising the steps of:
(a) continuously generating a series of pulses having a repetition frequency proportional to the amount of electrical energy being consumed by said time-of-day demand metering system;
(b) providing first and second counters capable of counting said pulses;
(c) continuously comparing the contents of said first and second counters;
(d) presetting said first counter to be prescribed count before a first demand interval;
(e) initiating a demand interval of a specified length of time during which the consumption of electrical energy may be registered;
(f) applying said pulses to said first counter in all demand intervals while selectively applying said pulses to said second counter during the periods of those demand intervals in which the amount of electrical energy being consumed is in excess of the one previous demand interval of maximum electrical energy consumption when the contents of said counters are at least equal;

(g) registering the amount of electrical energy being consumed during the period in each of those demand intervals when there is at least equality in the contents of said first and second counters;

(h) terminating the present demand interval while presetting said first counter to said prescribed count to inhibit the registering of electrical energy and any further counting of said pulses by said counters whereby the amount of electrical energy registered represents the amount of electrical energy consumed in the one previous demand interval of maximum electrical energy consumption; and (i) repeating steps (e) through (h) for a second demand interval.

10. A time-of-day demand metering system for registering the amount of electrical energy consumed during demand intervals comprising:

(a) selectively engageable means for registering the amount of electrical energy being consumed during said demand intervals;

(b) means for generating electrical pulses having a repetition frequency proportional to the amount of electrical energy being consumed by said time-of-day demand metering system;

(c) means for generating a control signal a prescribed intervals;

(d) means responsive, in a first instance, to said control signal for generating an end of interval signal and responsive, in a second instance, to said control signal and to a comparison signal for generating a demand interval on signal;

(e) means for controlling, during each demand interval, when the registering of the amount of electrical energy being consumed is to take place, said means for controlling including, (1) comparator means for generating said comparison signal, (2) first and second counter means, each receiving said electrical pulses and each having output terminals connected to said comparator means for providing count signals thereto, said first counter means being reset to zero in response to said end of interval signal and being enabled to count said electrical pulses during each demand interval in the absence of said end of interval signal, said second counter means, in response to said demand interval on signal, being enabled to count said electrical pulses during each demand interval when the contents of said first and second counter means are at least equal as detected by said comparator means generating said comparison signal, whereby the contents of said second counter means manifests a magnitude proportional to the amount of electrical energy consumed in a first demand interval plus that excess amount of electrical energy consumed in each subsequent demand interval in which the amount of electrical energy consumed is greater than the amount consumed in the one previous demand interval of maximum electrical energy consumption;

(f) means responsive to said demand interval on signal to selectively engage and disengage said means for registering, whereby, said means for registering registers the amount of electrical energy consumed during that one demand interval of maximum electrical energy consumption; and (g) reset switch means actuable to reset said first and second counter means to initialize said time-of-day demand metering system.

11. A three rate structured time-of-day demand metering system for registering the total amount of electrical energy consumed and the amount of electrical energy consumed during on-peak power periods and preselected demand intervals, comprising:

(a) a total register for continuously registering the amount of electrical energy being consumed by the system;

(b) an on-peak register engageable to register the amount of electrical energy consumed during said on-peak power periods;

(c) a demand register engageable to register the amount of electrical energy being consumed during said demand intervals;

(d) a programmable control circuit for generating a control signal at prescribed intervals to engage and disengage said on-peak register during on and off peak power periods respectively, and during demand intervals in which the amount of electrical energy consumed is to be measured;

(e) means for generating electrical pulses having a repetition frequency proportional to the amount of electrical energy being consumed by the system;

(f) on/off peak detector means responsive, in a first instance, to said control signal defining an off-peak power period for generating an off-peak signal and responsive, in a second instance, to said control signal defining an on-peak power period and to a comparison signal for generating a demand interval on signal;

(g) interval counter means responsive, in a third instance, to said control signal during an on-peak power period for generating an end of interval signal defining the end of a demand interval, said end of interval signal being provided to said on-off peak detector means to effect the generation of said off-peak signal;

(h) demand interval means for controlling, during each demand interval, when the registering of the amount of electrical energy being consumed is to take place, said demand interval means including, (1) comparator means for generating said comparison signal, (2) first and second counter means, each receiving said electrical pulses and each having output terminals connected to said comparator means for providing count signals thereto, said first counter means receiving said off-peak signal and responding thereto to remain in a reset state during the presence of said off-peak signal and being enabled to count said electrical pulses in the absence of said off-peak signal, said second counter means, in response to said demand interval on signal, being enabled to count said electrical pulses during each demand interval when the contents of said first and second counter means are at least equal as detected by said comparator means generating said comparison signal, whereby the contents of said second counter means manifests a magnitude proportional to the amount of electrical energy consumed in the one demand interval of maximum electrical energy consumption; and (i) means responsive to said demand interval on signal to selectively engage and disengage said demand register in accordance with said end of interval signal applied to said on/off peak detector means, whereby said demand register registers the amount of electrical energy consumed during that one demand interval of maximum electrical energy of consumption.

12. The three rate structured time-of-day demand metering system as recited in claim 11, further including reset switch means actuable to reset said first and second counter means to initialize said system.

13. In a time-of-day demand metering system, a method of registering the amount of electrical energy consumed during demand intervals comprising the steps of:
   (a) continuously generating an electrical signal representative of the amount of electrical energy being consumed by said time-of-day demand metering system;
   (b) providing from first and second means, first and second values respectively capable of being changed by said electrical signal applied to said first and second means during said demand intervals, said first value having a magnitude proportional to the amount of electrical energy being consumed during each demand interval, and said second value, at the termination of each demand interval, having a magnitude proportional to the amount of electrical energy consumed during the one previous demand interval of maximum electrical energy consumption;
   (c) continuously comparing the magnitudes of said first and second values;
   (d) presetting said first value to a prescribed magnitude before a first demand interval;
   (e) initiating a demand interval of a specified length of time during which the consumption of electrical energy may be registered;
   (f) during each demand interval, applying said electrical signal to said first means to change the magnitude of said first value, while selectively applying said electrical signal to said second means to update the magnitude of said second value during the period of those demand intervals in which the amount of electrical energy being consumed is in excess of the one previous demand interval of maximum electrical energy consumption when the magnitudes of said first and second values are at least equal;
   (g) registering the amount of electrical energy being consumed during the period in each of those demand intervals when there is at least equality in the magnitudes of said first and second values;
   (h) terminating the present demand interval while presetting said first value to said prescribed magnitude to inhibit the registering of electrical energy and any further changing of said first and second values by said electrical signal, whereby the amount of electrical energy registered represents the amount of electrical energy consumed in the one previous demand interval of maximum electrical energy consumption; and
   (i) repeating steps (e) through (h) for a second demand interval.

* * * * *